(12) United States Patent
Mamitsu et al.

(10) Patent No.: US 10,079,226 B2
(45) Date of Patent: *Sep. 18, 2018

(54) SEMICONDUCTOR DEVICE

(75) Inventors: Kuniaki Mamitsu, Okazaki (JP);
Takanori Teshima, Okazaki (JP)

(73) Assignee: DENSO CORPORATION, Kariya (JP)

( * ) Notice: Subject to any disclaimer, the term of this patent is extended or adjusted under 35 U.S.C. 154(b) by 423 days.

This patent is subject to a terminal disclaimer.

(21) Appl. No.: 13/357,690

(22) Filed: Jan. 25, 2012

(65) Prior Publication Data
US 2012/0119347 A1 May 17, 2012

Related U.S. Application Data

(63) Continuation of application No. 11/262,764, filed on Nov. 1, 2005, now Pat. No. 8,125,781.

(30) Foreign Application Priority Data

Nov. 11, 2004 (JP) .................................. 2004-327670

(51) Int. Cl.
*H01L 23/36* (2006.01)
*H01L 25/11* (2006.01)
(Continued)

(52) U.S. Cl.
CPC ............ *H01L 25/117* (2013.01); *H01L 23/40* (2013.01); *H01L 23/473* (2013.01); *H01L 25/115* (2013.01); *H05K 7/20927* (2013.01); *H01L 23/4012* (2013.01); *H01L 2224/40137* (2013.01); *H01L 2224/48091* (2013.01);
(Continued)

(58) Field of Classification Search
CPC ...... H01L 25/115; H01L 23/40; H01L 25/117; H01L 23/4012; H01L 2924/1301

USPC .... 62/3.2, 3.7; 165/80.4, 80.3, 233, 3.2, 3.7, 165/134.1, 135, 136, 143, 144, 154, 155; 257/712, 714, 715, 716, 721; 361/679.53, 361/698, 699

See application file for complete search history.

(56) References Cited

U.S. PATENT DOCUMENTS 3,622,754 A 11/1971 Hurko
3,780,356 A 12/1973 Laing
(Continued)

FOREIGN PATENT DOCUMENTS

DE 197 15 592 A1 10/1998
JP A-63-224243 9/1988
(Continued)

OTHER PUBLICATIONS

Office Action dated Dec. 7, 2007 in corresponding CN patent Application No. 200510119472X (and English translation).
(Continued)

*Primary Examiner* — Kun Kai Ma
(74) *Attorney, Agent, or Firm* — Posz Law Group, PLC

(57) ABSTRACT

A semiconductor device comprises at least a semiconductor module including a semiconductor chip, a heat sink thermally connected to the semiconductor chip and a seal member for covering and sealing the semiconductor chip and the heat sink in such a manner as to expose the heat radiation surface of the heat sink. The radiation surface is cooled by a refrigerant. An opening is formed in a part of the seal member as a refrigerant path through which the refrigerant flows.

45 Claims, 15 Drawing Sheets

(51) Int. Cl.
*H01L 23/473* (2006.01)
*H05K 7/20* (2006.01)
*H01L 23/40* (2006.01)

(52) U.S. Cl.
CPC .............. *H01L 2224/48247* (2013.01); *H01L 2224/73265* (2013.01); *H01L 2924/09701* (2013.01); *H01L 2924/1301* (2013.01); *H01L 2924/1305* (2013.01); *H01L 2924/13055* (2013.01); *H01L 2924/181* (2013.01); *H01L 2924/30107* (2013.01)

(56) References Cited

U.S. PATENT DOCUMENTS

| | | | |
|---|---|---|---|
| 4,520,383 A | | 5/1985 | Klein |
| 4,841,355 A | * | 6/1989 | Parks .................... H01L 25/105 257/686 |
| 4,956,746 A | * | 9/1990 | Gates et al. ................. 361/699 |
| 5,001,548 A | * | 3/1991 | Iversen .......................... 257/714 |
| 5,003,376 A | * | 3/1991 | Iversen ................. H01L 23/473 165/80.3 |
| 5,050,037 A | * | 9/1991 | Yamamoto .......... H01L 23/4332 165/80.4 |
| 5,329,160 A | | 7/1994 | Miura et al. |
| 5,606,201 A | | 2/1997 | Lutz |
| 5,608,610 A | | 3/1997 | Brzezinski |
| 5,737,186 A | * | 4/1998 | Fuesser ..................... F28F 3/12 165/80.4 |
| 5,841,634 A | * | 11/1998 | Visser ........................... 361/699 |
| 5,912,803 A | * | 6/1999 | Dahl ....................... H05K 5/061 165/185 |
| 6,072,240 A | | 6/2000 | Kimura et al. |
| 6,159,837 A | * | 12/2000 | Yamaji .................... H01L 24/11 257/E21.508 |
| 6,304,448 B1 | | 10/2001 | Fukada et al. |
| 6,448,645 B1 | | 9/2002 | Kimura et al. |
| 6,703,707 B1 | * | 3/2004 | Mamitsu ............... H01L 23/051 257/713 |
| 6,738,253 B2 | | 5/2004 | Beuille et al. |
| 6,822,865 B2 | * | 11/2004 | Balszunat et al. ............ 361/699 |
| 6,992,383 B2 | * | 1/2006 | Mamitsu et al. ............. 257/718 |
| 7,086,453 B2 | | 8/2006 | Lee et al. |
| 7,508,668 B2 | | 3/2009 | Harada et al. |
| 8,946,882 B2 | * | 2/2015 | Kato ..................... H01L 23/427 257/686 |
| 2001/0033477 A1 | * | 10/2001 | Inoue .................. H01L 23/4006 361/718 |
| 2002/0101718 A1 | * | 8/2002 | Negishi et al. ............... 361/699 |
| 2004/0006869 A1 | * | 1/2004 | Igarashi ................. C25D 5/026 29/847 |
| 2004/0210965 A1 | * | 10/2004 | Carozzi ................ C07K 14/325 800/279 |
| 2004/0212965 A1 | | 10/2004 | Ishii et al. |
| 2005/0030717 A1 | * | 2/2005 | Inagaki ............... H01L 23/4334 361/699 |
| 2005/0046020 A1 | * | 3/2005 | Andou ................ H01L 23/4334 257/724 |
| 2005/0056927 A1 | * | 3/2005 | Teshima .............. H01L 23/4334 257/712 |
| 2007/0215316 A1 | * | 9/2007 | Saito et al. ...................... 165/41 |
| 2011/0316142 A1 | * | 12/2011 | Noritake .............. H01L 23/051 257/713 |
| 2013/0335920 A1 | * | 12/2013 | Murata .............. H05K 7/20236 361/699 |

FOREIGN PATENT DOCUMENTS

| | | |
|---|---|---|
| JP | A-6-61391 | 3/1994 |
| JP | A-7-336077 | 12/1995 |
| JP | A-10-51169 | 2/1998 |
| JP | A-2001-53206 | 2/2001 |
| JP | A-2001-320005 | 11/2001 |
| JP | A-2002-315357 | 10/2002 |
| JP | A-2004-119667 | 4/2004 |

OTHER PUBLICATIONS

Office Action dated Sep. 24, 2008 in corresponding JP patent Application No. 2004-326117 (and English translation).
Second Office Action dated May 8, 2009 from the Chinese State Intellectual Property Office for the corresponding CN patent Application No. 200510119472.X (and English translation).
Third Office Action dated Sep. 4, 2009 from the Chinese State Intellectual Property Office for the corresponding CN patent Application No. 200510119472.X (and English translation).
Office Action dated May 30, 2013 in the corresponding CN application No. 201010286460.7 (English translation).
Office Action dated Sep. 9, 2013 in the corresponding DE application No. 10 2005 052 756.6 (and English translation).
Office Action dated Feb. 14, 2016 issued in corresponding CN patent application No. 201410049890.5 (and English translation).

\* cited by examiner

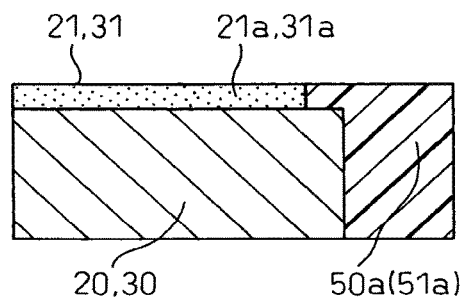
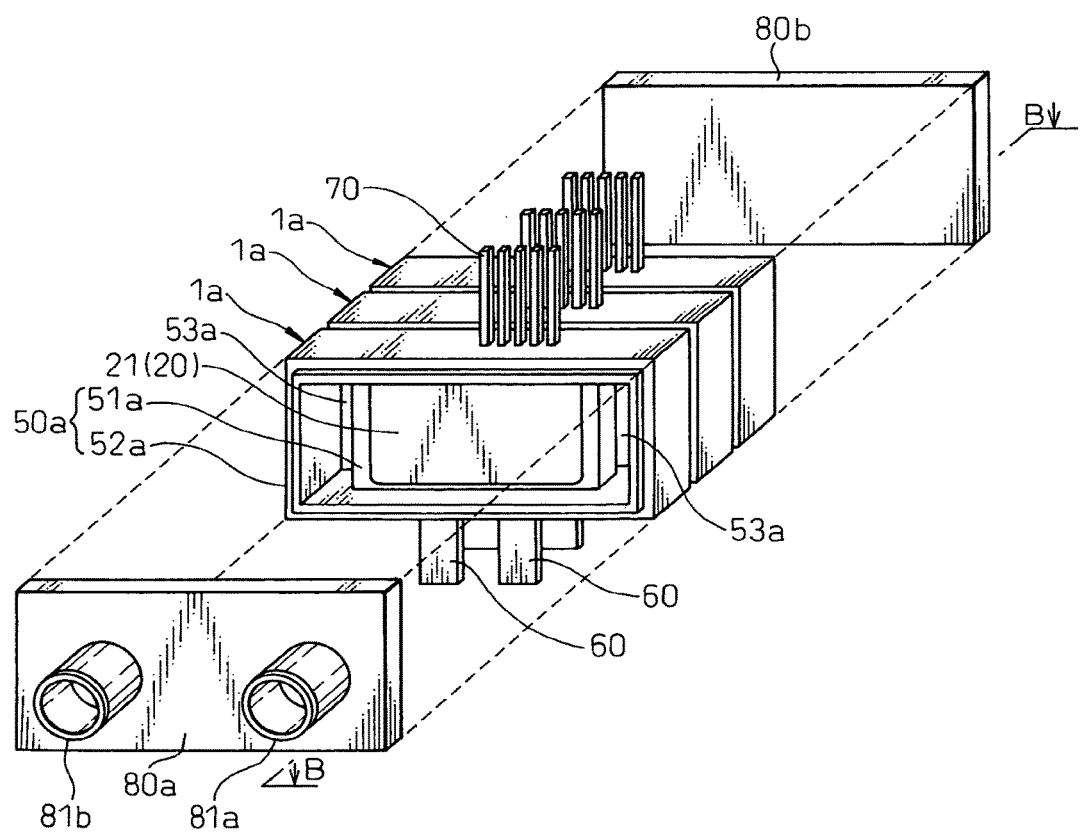

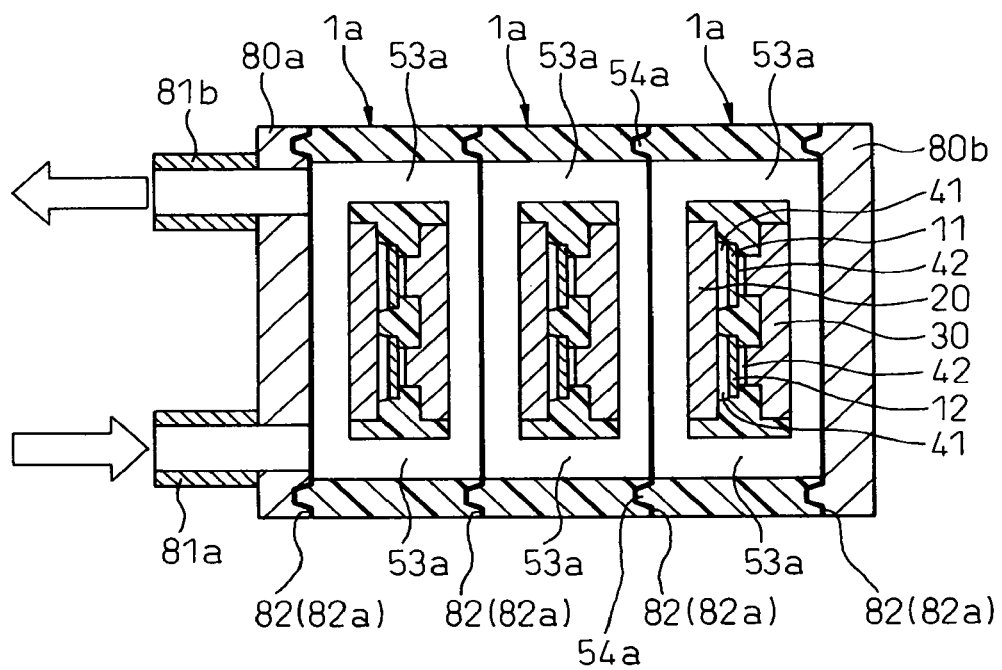

SEMICONDUCTOR DEVICE

CROSS REFERENCE TO RELATED APPLICATIONS

This application is a continuation of U.S. application Ser. No. 11/262,764 filed on Nov. 1, 2005, which is based on and claims priority to Japanese Patent Application No. 2004-327670filed on Nov. 11, 2004, the disclosure of which is incorporated herein by reference.

BACKGROUND OF THE INVENTION

1. Field of the Invention

This invention relates to a semiconductor device comprising a semiconductor module fabricated by sealing a semiconductor element connected to a heat radiation metal plate of which a surface is cooled by a refrigerant, and also relates to a semiconductor device comprising a stack of semiconductor modules.

2. Description of the Related Art

The semiconductor device of this type generally comprises a semiconductor module including at least a semiconductor element, at least a metal plate thermally connected with the semiconductor element to transmit the heat from the semiconductor element and a seal member for containing and sealing the semiconductor element and the metal plate in such a manner as to expose the heat radiation surface of the metal plate. The radiation surface of the metal plate is cooled by a refrigerant.

This semiconductor device is so configured as to easily radiate the heat generated in the semiconductor element. Therefore, for example, the semiconductor device is used for a power converter. In recent years, demand for a lower cost and a smaller size of this device has increased.

A conventional semiconductor device having a simple cooling structure for heat radiation has been proposed, in which a semiconductor module sealed with seal member are fixed at an upper wall and a bottom plate in a case to form a refrigerant path between semiconductor module and the case, (see Japanese Unexamined Patent Publication No. 2004-119667.

However, the refrigerant paths of the conventional art are formed between the semiconductor module and the case and, therefore, the space for arranging the cases is required, thereby correspondingly increasing the size of the device as compared with the semiconductor module.

SUMMARY OF THE INVENTION

In view of the above-mentioned problem, the object of this invention is to realize a compact, simple cooling structure in a semiconductor device comprising at least a semiconductor module including a semiconductor element connected with a heat radiating metal plate, which is sealed with a seal member, wherein the heat radiation surface of the metal plate is cooled by a refrigerant.

In order to achieve this object, according to this invention, there is provided a semiconductor device comprising at least one semiconductor module (1) including a semiconductor element (11, 12), a metal plate (20, 30) thermally connected with the semiconductor element (11, 12) for transmitting the heat from the semiconductor element (11, 12) and a seal member (50) for covering and sealing the semiconductor elements (11, 12) and the metal plate (20, 30) in such a manner as to expose the heat radiation surface (21, 31) of the metal plate (20, 30), wherein the heat radiation surface (21, 31) of the metal plate (20, 30) is cooled with a refrigerant, and wherein a part of the seal member (50) is formed as a refrigerant path (53) in which the refrigerant flows.

In view of the fact that a part of the seal member (50) of the semiconductor module (1) is formed as the refrigerant path (53), additional parts such as a cooling tube and a case required in the prior art are eliminated, and therefore the semiconductor device can be reduced in size.

According to the present invention, a compact, simple cooling structure can be realized in a semiconductor device comprising the semiconductor module (1) including the semiconductor element (11, 12) connected to the metal plate (20, 30), which is sealed with the seal member (50), wherein the radiation surfaces (21, 31) of the metal plate (20, 30) are cooled by the refrigerant.

The seal member (50) includes a sealing part (51) for sealing the semiconductor element (11, 12) and the metal plate (20, 30) and the wall part (52) arranged around the sealing part (51) and having an open end thereof positioned far from the radiation surface (21, 32) of the metal plate (20, 30). An opening (53) of the sealing part (51) is formed as the refrigerant path between the metal plate (20, 30) and the wall part (52).

The wall part (52) can be arranged so as to surround the side of the metal plate (20, 30).

The seal member (50) includes the sealing part (51) for sealing the semiconductor element (11, 12) and the metal plate (20, 30), and the wall part arranged around the sealing part (51) (52) having an open end thereof positioned far from the heat radiation surface (21, 31) of the metal plate (20, 30). An opening of the wall part (52) is formed as the refrigerant path.

The seal member (50) can be formed of resin.

The radiation surfaces (21, 31) of the metal plate (20, 30) may be rough. The radiation surfaces (21, 31) of the metal plate (20, 30) may have at least one fin (83) projected from the same surface. By doing so, the heat radiation performance of the semiconductor module (1) can be improved.

The heat radiation surface (21, 31) of the metal plate (20, 30) can be electrically insulated from the semiconductor element (11, 12). By doing so, if the refrigerant is water or the like conductive material, the circuit of the semiconductor element (11, 12) can be properly insulated. In this case, the heat radiation surface (21, 31) of the metal plate (20, 30) may be the surface of insulating layer (21a, 31a) formed on the surface of the metal plate (20, 30).

The heat radiation surface (21, 31) of the metal plate (20, 30) may not be electrically insulated. In the case where the refrigerant is an electrically insulating material such as air or oil, it is not necessary to insulate the heat radiation surfaces (21, 31) of the metal plate (20, 30).

The inner wall surface of the refrigerant path can be covered with a film (84) having a corrosion resistance against the refrigerant. By doing so, the corrosion resistance against the refrigerant is improved advantageously.

Electrode terminals for a main current (60) can be projected from one side of the semiconductor module (1), and control terminals (70) can be arranged on the opposite side of the semiconductor module (1). According to this invention, due to the absence of a case, the electrode terminals (60) and the control terminals (70) can be projected in two directions from the two opposite sides of the semiconductor module (1).

In the conventional semiconductor device, projection of terminals in two opposite directions would increase the sealing points of the bottom plate of the case and complicate both the structure and assembly work. Therefore, the terminals have been often led out only in one direction from the semiconductor module. Thus, the terminal wires have to be arranged in a space and the insulation distance among the terminal wires cannot be large. Therefore, to prevent this inconvenience, a device size has been unavoidably increased. According to one aspect of the invention, in contrast, the terminals can be arranged in two directions and therefore a more compact device can be obtained advantageously.

A plurality of the semiconductor modules (1) can be stacked and connected while the respective refrigerant paths (53) can communicate with each other. Also, the stacked semiconductor modules (1) can be connected to each other while the respective refrigerant paths (53) can communicate with each other, and at the same time, each semiconductor module (1) can be connected on the side or end surface of the wall part (52).

In the conventional semiconductor device configured of the stacked semiconductor modules the following problem is posed. Specifically, in view of the fact that the cooling members such as the cooling tube for cooling the semiconductor modules are stacked with the semiconductor modules, the stack structure is configured of different types of members. Therefore, a plurality of cooling tubes are required to be connected and a multiplicity of liquid sealing points are required, thereby complicating the assembly work. Also, in order to keep the cooling members and the radiation surfaces of the metal plate in contact with each other by pressing the cooling members against the radiation surfaces of the metal plate, a pressure mechanism is required. For example, a contractible member such as a bellows must be arranged between a plurality of the cooling members. This makes a device large and complicates the structure. Also, in view of the fact that different types of members including the semiconductor module and the cooling member are stacked, the cumulative error between them increases and so does the thickness variations along the direction of the stack. This also causes variations of the terminal positions of the semiconductor module, thereby making it difficult to set in position the terminals for mounting the semiconductor device on a circuit board.

To cope with this problem, a semiconductor device comprising the stacked semiconductor modules according to aspects of the invention produces a unique effect described below. Specifically, since a part of the seal member (50) of the semiconductor module (1) is formed as the refrigerant path, the whole refrigerant path can be configured simply by connecting the individual semiconductor modules (1). As a result, the pressure mechanism and the additional cooling members used in the prior art are eliminated, and the cooling structure can be easily realized. Also, the semiconductor module (1) is produced by molding the seal member (50), and therefore, an outer dimensional accuracy very high or, for example, as high as ±0.1 mm or less can be easily achieved as compared with the prior art. Even in the case where a multiplicity of semiconductor modules (1) are connected, therefore, the positional accuracy of the terminals is improved over the prior art.

Further, the connecting surface of the wall part (53) has a positioning concave or convex form, and therefore the wall parts (52) can be connected easily to each other.

The wall parts (53) can be connected to each other by adhesive.

The stacked semiconductor modules (1) are arranged in such a manner that the radiation surfaces (21, 31) of the metal plate (20, 30) are placed opposite to each other and each has at least one fin projecting therefrom (83). The relation can hold that hf<D, where hf is the height of the fins (83) and D the height of the wall part (52) from the radiation surfaces (21, 31) of the metal plate (20, 30). Alternatively, the relation may be hf≥D, and the positions of the fins on the heat radiation surfaces (21, 31) differ between one of the heat radiation surfaces and the other opposite heat radiation surface. In this case, the fins (83) are in the form of comb teeth projected from the radiation surfaces (21, 31) of the metal plates (20, 30), and the fins (83) on the one of the radiation surfaces are placed between the fins (83) on the other opposite radiation surface. By doing so, the fins (83) formed on the radiation surfaces (21, 31) of the metal plate (20, 30) in opposed relation to each other of the stacked semiconductor modules (1) are advantageously prevented from interfering with each other.

The side shape of the wall part of the seal member may be an inverted trapezoid. The stacked semiconductor modules can be formed by bonding the open ends of the wall parts to be communicated with all refrigerant paths. In the case where the semiconductor device according to this aspect of the invention is used as an inverter of a motor or the like, the similarity of the semiconductor device to the rotary machine such as the motor can reduce the wiring distance, simplify the connections and effectively reduces noise.

Also, the stacked semiconductor modules (1) can be configured as a power circuit. A first bus bar (91) and a second bus bar (92) forming the input connecting wires of the power circuit are preferably arranged in parallel and proximity to each other.

An insulating member (94) can be interposed between the first bus bar (91) and the second bus bar (92). Alternatively, the first bus bar (91) and the second bus bar (92) are covered and sealed by an insulating member (95). With the configuration of the semiconductor device using the insulating members (94, 95) according to these aspects of the invention, the electrical insulation is secured between the first bus bar (91) and the second bus bar (92) and, therefore, the interval between the first bus bar (91) and the second bus bar (92) can be reduced, thereby making it possible to reduce both the device size and the parasitic inductance of the wiring advantageously.

A semiconductor device according to the present invention can further comprise at least another component module sealed with a seal member having a refrigerant part. The (85, 86, 87) can be stacked with component module the semiconductor modules (1) and cooled together by the refrigerant.

The metal plate (20, 30) of the semiconductor module (1) are arranged on at least one side of the semiconductor element (11, 12), and only the surface of the metal plate (20, 30) formed on the one side of the semiconductor element (11, 12) is exposed from the seal member (50). These exposed surface of the metal plate (20, 30) may be formed as the heat radiation surface (21, 31).

Visible surfaces of the stacked semiconductor modules (1) can form the printing surfaces of the semiconductor modules (1). By doing so, even in the stacked semiconductor modules (1), the printing surfaces can be checked visually, and therefore the serial numbers, etc. can be advantageously confirmed.

According to still another aspect of the invention, the stacked semiconductor modules (1) are connected to each other by being held under the pressure by cover plates (80) arranged at the ends thereof. Each adjoining semiconductor modules (1) is kept in contact with an O-ring (8a) so as to seal contact portions between the semiconductor modules (1). As a result, the refrigerant path is formed by contact pressure through the O-ring (82a), and therefore, a defective module, if included in the plurality of the stacked semiconductor modules (1), can be easily replaced or repaired.

The reference numerals in the parentheses designating the component elements described above indicate an example of correspondence with the specific means included in the embodiments described later.

BRIEF DESCRIPTION OF THE DRAWINGS

These and other objects and features of the present invention will become clearer from the following description of the preferred embodiments given with reference to the attached drawings, wherein:

FIG. 2 is an enlarged sectional view schematically showing the neighborhood of the heat radiation surfaces according to a modification of the first embodiment;

FIG. 3A shows a configuration of a semiconductor device comprising a plurality of semiconductor modules connected to each other according to the first embodiment;

FIG. 3B is a sectional view taken in line B-B in FIG. 3A;

DESCRIPTION OF THE PREFERRED EMBODIMENTS

Figure 1A:
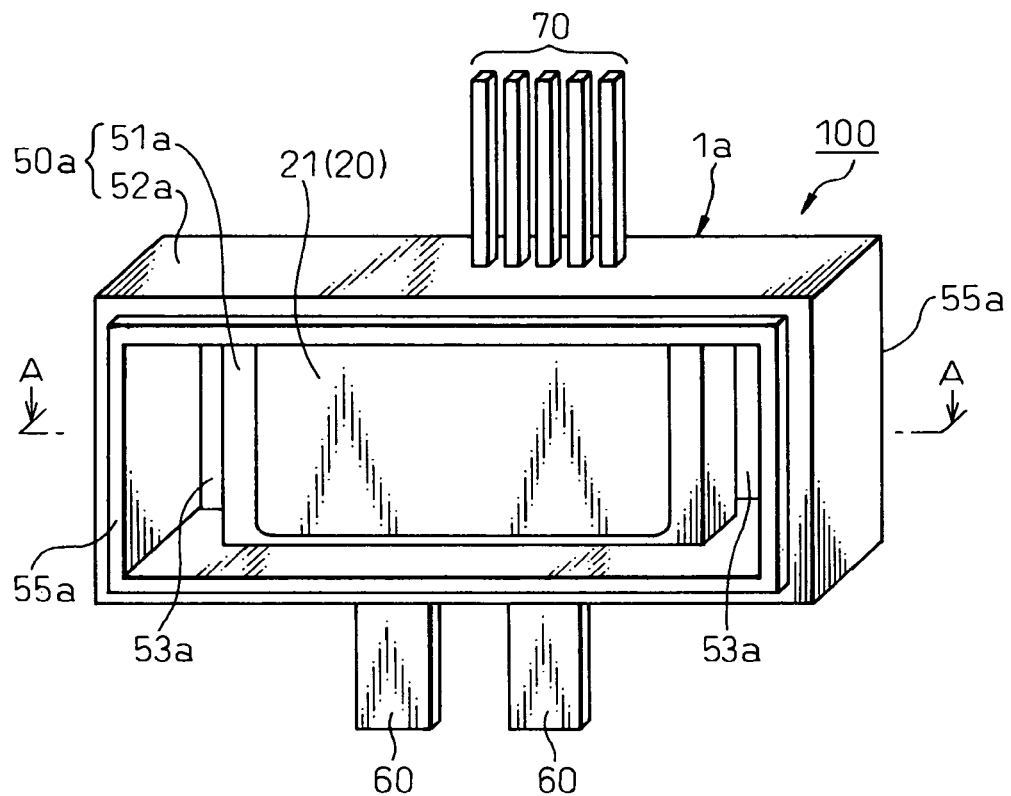
FIG. 1A is a perspective view schematically showing a semiconductor device according to a first embodiment of the invention.

Embodiments of the invention are described below with reference to the drawings. In each embodiment described below, the same or equivalent component parts are designated by the same reference numerals, respectively, to simplify the explanation.

(First Embodiment)

Figure 1B:
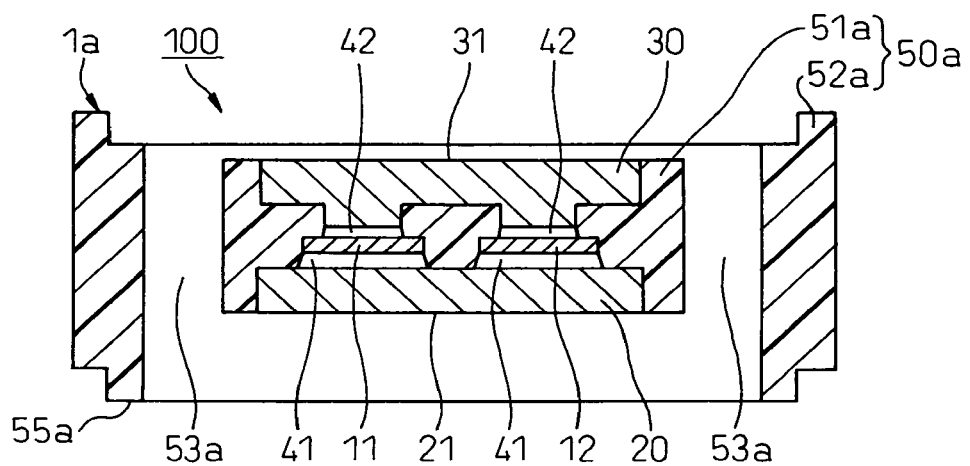
FIG. 1B is a sectional view taken in line A-A in FIG. 1A.

FIG. 1A is a perspective view showing a general configuration of a semiconductor device 100 according to a first embodiment of the invention. FIG. 1B is a diagram showing a sectional configuration along the one-dot chain line A-A in FIG. 1A.

As shown in FIGS. 1A, 1B, the semiconductor device 100 according to this embodiment is mainly configured of a semiconductor module 1a.

The semiconductor module 1 shown in FIGS. 1A, 1B includes a first semiconductor chip 11 and a second semiconductor chip 12 as semiconductor elements, a lower heat sink 20 as a first metal plate, an upper heat sink 30 as a second metal plate, solder 41, 42 as conductive joint interposed between the semiconductor elements and the lower heat sink 20 or the upper heat sink 30, and a molded resin 50 as a seal member.

In the semiconductor module 1a according to this embodiment, as shown in FIGS. 1A and 1B, the first semiconductor chip 11 and the second semiconductor chip 12 are arranged in parallel to each other on a plane. Although two semiconductor elements are shown in FIG. 1B, only one semiconductor element or three or more semiconductor elements may alternatively be included.

In this configuration of the semiconductor module 1a, the rear surfaces (lower surfaces in FIG. 1B) of the semiconductor chips 11, 12 and the upper surface of the lower heat sink 20 are joined to each other by the first solder 41.

Also, as shown in FIG. 1B, the front surfaces (upper surfaces in FIG. 1B) of the semiconductor chips 11, 12 and the lower surface of the upper heat sink 30 are joined to each other by the second solder 42.

The lower parts of the upper heat sink 30 are projected to the semiconductor chips 11, 12, and the projected part surfaces and the upper surfaces of the semiconductor chips 11, 12 are joined to each other by the second solder 42, respectively.

In this upper heat sink 30, the function of the projected parts described above, though not shown in FIGS. 1A, 1B, is to secure the height of the bonding wires drawn from the semiconductor chips 11, 12. The projected parts also function to secure the height between the semiconductor chips 11, 12 and the upper heat sink 30.

In place of the projected parts, independent heat sink blocks for the semiconductor chips 11, 12 may be interposed between the upper surfaces of the semiconductor chips 11, 12 and the upper heat sink 30.

This heat sink blocks can be arranged through solder or the like, in which case the heat sink blocks function to secure the height between the semiconductor chips 11, 12 and the upper heat sink 30.

According to this embodiment, any of the widely-used lead-free solder such as Sn—Pb or Sn—Ag solder can be used as the solder 41, 42.

As a result, in the configuration described above, heat is radiated through the second solder 42 and the upper heat sink 30 on the front surfaces of the first and second semiconductor chips 11, 12, while heat is radiated through the first solder 41 and the lower heat sink 20 on the rear surfaces of the first and second semiconductor chips 11, 12.

As described above, the lower heat sink 20 and the upper heat sink 30 are formed with metal plates which are thermally connected to the first and second semiconductor chips 11, 12, which are semiconductor elements, and transmit heat from the semiconductor chips 11, 12.

In the lower heat sink 20, the lower surface thereof in FIG. 1B is the heat radiation surface 21. In the upper heat sink 30, on the other hand, the upper surface thereof in FIG. 1B is the heat radiation surface 31. As shown in FIGS. 1A and 1B, the heat radiation surfaces 21, 31 are exposed from the molded resin 50a.

The first semiconductor chip 11, though not specifically limited, can be, for example, a power semiconductor element such as IGBT (insulated gate bipolar transistor) or a thyristor.

Similarly, the second semiconductor chip 12 can be, for example, a FWD (free wheel diode). Specifically, the first and second semiconductor chips 11, 12 can have a shape of, for example, a rectangular thin plate.

Circuit elements such as transistors are formed on the front surfaces of the first and second semiconductor chips 11, 12 while no elements are formed on the rear surfaces thereof.

According to this embodiment, electrodes (not shown) are formed on the front and rear surfaces of the first and second semiconductor chips 11, 12. The electrodes are electrically connected to the solders 41, 42.

The electrodes on the rear surfaces of the first and second semiconductor chips 11, 12 are electrically connected to the lower heat sink 20, or the first metal plate, through the first solder 41, while the electrodes on the front surfaces of the first and second semiconductor chips 11, 12 are electrically connected to the upper heat sink 30, or the second metal plate, through the second solder 42.

The lower heat sink 20 and the upper heat sink 30 are made of metal having high in heat conductivity and electrical conductivity such as a copper alloy or an aluminum alloy. Also, the lower heat sink 20 and the upper heat sink 30 can be formed with a rectangular plate, for example.

Electrode terminals for main current 60 are integrated with the lower heat sink 20 and the upper heat sink 30 and projected out of the molded resin 50a.

The electrode terminals 60 function as lead electrodes of the semiconductor chips 11, 12, whereby the semiconductor device 100 can be connected with external wiring such as a bus bar.

Thus, the lower heat sink 20 and the upper heat sink 30 are formed as the first and second metal plates serving as an electrode as well as a heat radiator. That is, the lower heat sink 20 and the upper heat sink 30 have the dual functions of radiating heat from the semiconductor chips 11, 12 and conducting electricity to the semiconductor chips 11, 12 of the semiconductor device 100.

It is apparent that the thermal and electrical connection between the semiconductor chips 11, 12 and the heat sinks 20, 30 is possible also by use of a conductive adhesive or the like in place of the solder 41, 42.

The semiconductor module 1a has also control terminals 70, which are formed of lead frames or the like around the semiconductor chips 11, 12. The control terminals 70 are hermetically fixed by the molded resin 50a and each end of the terminals 70 is projected out of the molded resin 50.

The end of each control terminal 70 can be connected electrically to, for example, an external control circuit board. Thus, the semiconductor device 100 is electrically connected to the control circuit board.

The control terminals 70 include a reference terminal or a terminal connected with a signal electrode (such as a gate electrode) formed on the surfaces of the semiconductor chips 11, 12. The control terminals 70 are electrically connected to the semiconductor chips 11, 12 by bonding wires or the like (not shown).

The electrode terminals for main current 60 are projected from one side of the semiconductor module 1a, and the control terminals 70 are arranged on the opposite side of the semiconductor module 1a. In other words, the main current electrode terminals 60 and the control terminals 70 are arranged in two opposite directions on both sides of the semiconductor module 1a.

Further, semiconductor module 1a according to this embodiment is sealed or molded by the molded resin 50a, which is a seal member, in such a manner as to expose the heat radiation surfaces 21, 31 of the heat sinks 20, 30. Specifically, as shown in FIG. 1B, the molded resin 50 is filled in the gap between the pair of the heat sinks 20, 30 and around the semiconductor chips 11, 12.

Ordinary molding material such as epoxy resin can be used for the molded resin 50. The heat sinks 20, 30 can be easily molded with the molded resin 50a by such a method as a potting or a transfer molding using a molding die.

As described above, the semiconductor device 100 according to this embodiment basically comprises the semiconductor module 1a including the semiconductor chips 11, 12 as semiconductor elements, the heat sinks 20, 30 as metal plates thermally connected to the semiconductor chips 11, 12 to transfer heat from the semiconductor chips 11, 12 and the molded resin 50 as a seal member to hermetically seal the semiconductor chips 11, 12 and the heat sinks 20, 30 in such a manner as to expose the heat radiation surfaces 21, 31 of the heat sinks 20, 30.

Further, in the semiconductor device 100 according to this embodiment, the heat radiation surfaces 21, 31 of the heat sinks 20, 30 of the semiconductor module 1a are cooled by a refrigerant. The refrigerant is a fluid such as air, water or oil. Specifically, the refrigerant is the cooling water or the oil for automobiles on which the semiconductor device 100 is mounted.

The cooling structure described above is unique to this embodiment, in which as shown in FIGS. 1A, 1B, a part of the molded resin 50a, which is a seal member, of the semiconductor module 1a is used as the refrigerant path 53.

Specifically, as shown in FIGS. 1A and 1B, the molded resin 50a includes a sealing part 51a for sealing the semiconductor chips 11, 12 and the heat sinks 20, 30, and a wall part 52a arranged around the sealing part 51a and having open ends 55a projected more than the heat radiation surfaces 21, 31 of the heat sinks 20, 30. In this embodiment, the wall part 52a are arranged in annular form surrounding the heat radiation surfaces 21, 31.

In the semiconductor device 100 according to this embodiment, openings 53*a* are formed between the heat sinks 20, 30 of the sealing part 51 and the wall part 52, and the openings 53*a* are used as a refrigerant path.

The configuration of the molded resin 50*a* can be easily realized with a die molding or the like process. Also, in the molded resin 50*a*, the sealing part 51*a* and the wall part 52*a* may be separated. After forming the sealing part 51, for example, the wall part 52*a* may be formed integrally with the sealing part 51*a* by bonding or the like.

Next, a method of fabricating the semiconductor device 100 having the above-mentioned configuration will be explained briefly with reference to FIGS. 1A and 1B.

First, the first and second semiconductor chips 11, 12 are soldered on the upper surface of the lower heat sink 20. In this case, the first and second semiconductor chips 11, 12 are stacked on the upper surface of the lower heat sink 20 each through, for example, a Sn solder foil.

After that, the assembly is heated to beyond the melting point of the solder by a heater (reflow soldering). In this way, the solder foil, after being melted, is cooled and hardened. Then, the control terminals 70 are connected with the semiconductor chips 11, 12 by wire bonding as required.

Then, the upper heat sink 30 is soldered on the first and second semiconductor chips 11, 12. In the process, the upper heat sink 30 is placed on the semiconductor chips 11, 12 each through a solder foil, and the solder foil is melted and hardened by a heater.

Each melted solder foil, after being hardened in this way, becomes the first solder 41 and the second solder 42 described above. Through solders 41, 42, the lower heat sink 20, the first and second semiconductor chips 11, 12 and the upper heat sink 30 can be mechanically, electrically and thermally connected to each other.

As described above, a conductive adhesive can be used in place of the solder 41, 42. In such a case, the joining process is executed using the conductive adhesive instead of the solder.

After that, the molded resin 50*a* is filled in the gap and on the outer periphery of the heat sinks 20, 30 by the transfer molding or potting. At the same time, the openings 53*a* are formed as a refrigerant path.

As a result, as shown in FIGS. 1A and 1B, the molded resin 50*a* is filled in the gap and on the outer periphery of the heat sinks 20, 30 thereby to seal the semiconductor chips 11, 12 and the heat sinks 20, 30, while at the same time forming the openings 53*a* as a refrigerant path. In this way, the semiconductor device 100 comprising the semiconductor module 1*a*, is completed.

According to this embodiment, there is provided a semiconductor device 100 comprising the semiconductor module 1*a* including the semiconductor chips 11, 12 as semiconductor elements, the heat sinks 20, 30 as metal plates thermally connected with the semiconductor chips 11, 12 for transmitting heat from the semiconductor chips 11, 12, and the molded resin 50*a* as a seal member for covering and sealing the semiconductor chips 11, 12 and the heat sinks 20, 30 in such a manner as to expose the heat radiation surfaces 21, 31 of the heat sinks 20, 30, wherein the heat radiation surfaces 21, 31 are cooled by the refrigerant and wherein a part of the molded resin 50*a* is formed as a refrigerant path 53.

A part of the molded resin 50*a* of the semiconductor module 1 is configured as the refrigerant paths 53 through which the refrigerant flows, and therefore such independent members as a cooling tube and a case are not required, unlike in the prior art, thereby decreasing the size of the device.

Thus, according to this embodiment, there is provided a compact, simple cooling structure of a semiconductor device 100 comprising the semiconductor module 1 including the semiconductor chips 11, 12 connected with the heat radiating heat sinks 20, 30 and sealed with the molded resin 50, wherein the heat radiation surfaces 21, 31 of the heat sinks 20, 30 are cooled by the refrigerant.

Specifically, according to the prior art, cooling tubes, cooling fins or a case to form a refrigerant path are arranged on the outside of the semiconductor module, which has a package to seal the semiconductor by a seal member of resin or the like, thereby increasing the size of the device. The size of the semiconductor device 100 according to this embodiment, on the other hand, can be maintained substantially within the outline of the seal member, i.e. the size of the semiconductor package.

Also, according to this embodiment, the molded resin 50*a* includes the sealing part 51*a* for sealing the semiconductor chips 11, 12 and the heat sinks 20, 30, and the wall part 52*a* surrounding the sealing part 51*a* and having opening ends projected more than the heat radiation surfaces 21, 31 of the heat sinks 20, 30, wherein the openings 53*a* of the sealing part 51*a* is formed as the refrigerant path between the metal plate 20, 30 and the wall part 52*a*.

Further, one of the features of this embodiment lies in that the wall part 52*a* is arranged in annular form to surround the side of the heat sinks 20, 30. According to this embodiment, the molded resin 50*a* having the wall part 52*a* can properly realize the openings 53 as a refrigerant path.

According to this embodiment, the molded resin 50*a* is used as the seal member. Nevertheless, any electrically insulating material other than resin, such as a ceramic, can be adopted to seal the elements.

Further, as another feature of this embodiment, as shown in FIG. 1A, the electrode terminals for main current 60 are projected from one side of the semiconductor module 1*a*, and the control terminals 70 are arranged on the opposite side of the semiconductor module 1*a*.

As described above, with the semiconductor device 100 according to this embodiment, the absence of the case or the like makes it possible to project the electrode terminals 60 and the control terminals 70 from the opposite sides of the semiconductor module 1*a*.

The conventional semiconductor device has unavoidably increased in size, because the terminals had to be led out only in one direction from the semiconductor module, and the insulation distance of the wires connected to the terminals had to be secured in the same space.

According to this embodiment, in contrast, the two types of terminals 60, 70 can be arranged in two opposite directions, and therefore the size of the semiconductor device 100 can be advantageously reduced.

FIG. 2 is an enlarged sectional view showing the neighborhood of the heat radiation surfaces 21, 31 of the heat sinks 20, 30 of the semiconductor device 100 according to a modification of the first embodiment.

As shown in FIG. 2, electrical insulating layers 21*a*, 31*a* are formed on the surfaces of the heat sinks 20, 30 exposed from the molding compound 50. The surfaces 21*a*, 31*a* are used as heat radiation surfaces 21, 31.

In FIG. 2, the insulating layers 21*a*, 31*a* are shown in the same part. Actually, however, the insulating layer 21*a* is of course arranged on the surface of the lower heat sink 20, and the insulating layer 31a on the surface of the upper heat sink 30.

This configuration electrically insulates the heat radiation surfaces 21, 31 of the heat sinks 20, 30 from the refrigerant. As a result, even if the refrigerant is an electrically conductive material such as water, the circuits of the semiconductor chips 11, 12 cannot be adversely affected.

The insulating layers 21a, 31a may be made of a resin of a high heat conductivity such as polyamide mixed with alumina or glass filler, or a ceramic substrate metallized or brazed with a metal foil and soldered to the heat sinks 20, 30.

If the refrigerant is an electrical insulating material such as air or oil, the heat radiation surfaces 21, 31 of the heat sinks 20, 30 may not be electrically insulated from the semiconductor chips 11, 12. In such a case, the insulating layers 21a, 31a are not formed, and the surfaces of the heat sinks 20, 30 serve as the heat radiation surfaces 21, 31.

FIGS. 1A and 1B show only one semiconductor module 1a. According to this embodiment, however, the semiconductor device may include a plurality of connected semiconductor modules.

FIGS. 3A, 3B are diagrams showing an example of the semiconductor device according to this embodiment comprising a plurality of the connected semiconductor modules 1 having the respective refrigerant paths 53a communicating with each other. FIG. 3A is an exploded perspective view of the semiconductor device, and FIG. 3B a sectional view of the semiconductor device taken in one-dot chain line B-B in FIG. 3A.

In the semiconductor device shown in FIGS. 3A and 3B, a plurality of (three pieces in the shown case) semiconductor modules 1 are stacked and connected in sequence with the refrigerant paths thereof as the openings 53a communicating with each other.

The first semiconductor module 1a in the stack structure has a cover plate 80a having a refrigerant inlet 81a and a refrigerant outlet 81b. The inlet 81a and the outlet 81b communicate with the openings 53.

The last semiconductor module 1a of the stack, on the other hand, has a cover plate 80b having no inlet or outlet, whereby the open end of the last semiconductor module 1a are closed. In this way, the inlet 81a, the outlet 81b and the openings 53 are connected to each other, so that the refrigerant entering the inlet 81a flows out of the outlet 81b through the openings 53 to come into contact with the metal plates 20, 30.

The cover plate 80a having the inlet 81a and the outlet 81b and the cover plate 80b no inlet and outlet can be fabricated by forming or pressing a material such as resin, metal or ceramics.

In the plurality of the stacked semiconductor modules 1, the heat radiation surfaces 21, 31 thereof are arranged in opposed relation to each other, and the refrigerant flows through the refrigerant path between the opposed heat radiation surfaces 21, 31.

The semiconductor modules 1a are connected to the adjoining semiconductor modules 1a at the ends of each wall part 52a and the first and the last of the semiconductor modules 1a are respectively connected to the cover plates 80a, 80b at the other end of the wall part 52a. The ends of the wall parts 52a is bonded by using an adhesive 82.

Further, as shown in FIG. 3B, the end surfaces of each wall part 52a, which is used to connect the modules or cover plates, preferably a concave or a convex portion for the positioning purpose. In FIG. 3B, the end surfaces of each wall part 52a has a convex portion 54a or a corresponding concave portion, respectively. The convex portion of the wall part 52a is adapted to engage the concave portion of the adjoining wall part 52.

In the semiconductor device shown in FIGS. 3A, 3B, a plurality of the semiconductor modules 1 are stacked, and openings 53a formed in the molded resin 50a of each semiconductor module 1a serve as a part of the refrigerant path. Simply by connecting the individual semiconductor modules 1a, therefore, the refrigerant path can be configured.

In forming the refrigerant path, the pressure mechanism and additional cooling members are not required unlike in the prior art, and therefore the cooling structure according to the embodiment can be easily realized. As a result, the device is reduced in size and simplified, thereby making it possible to simplify the assembly work.

As each semiconductor module 1a is formed by molding resin, a very high outer dimensional accuracy (e.g. ±0.1 mm or less) as compared with the prior art can be easily achieved.

Even in the case where a multiplicity of the semiconductor modules 1 are connected, therefore, the positional accuracy of the terminals, i.e. the main current electrode terminals 60 and the control terminals 70 of the stacked semiconductor modules 1 can be improved over the prior art, which advantageously facilitate the positioning of the terminals of the semiconductor device when mounted on an external circuit board.

In the semiconductor device shown in FIGS. 3A, 3B, the end surfaces of the wall parts 52 to be connected have a convex portion or a concave portion corresponding to the convex portion for the positioning purpose, and therefore the interconnection of the wall parts 52 is facilitated.

(Second Embodiment)

According to the second embodiment of the invention, the heat radiation surfaces 21, 31 of the heat sinks 20, 30 are formed with fins or the like to improve the heat radiation performance.

Figure 4:
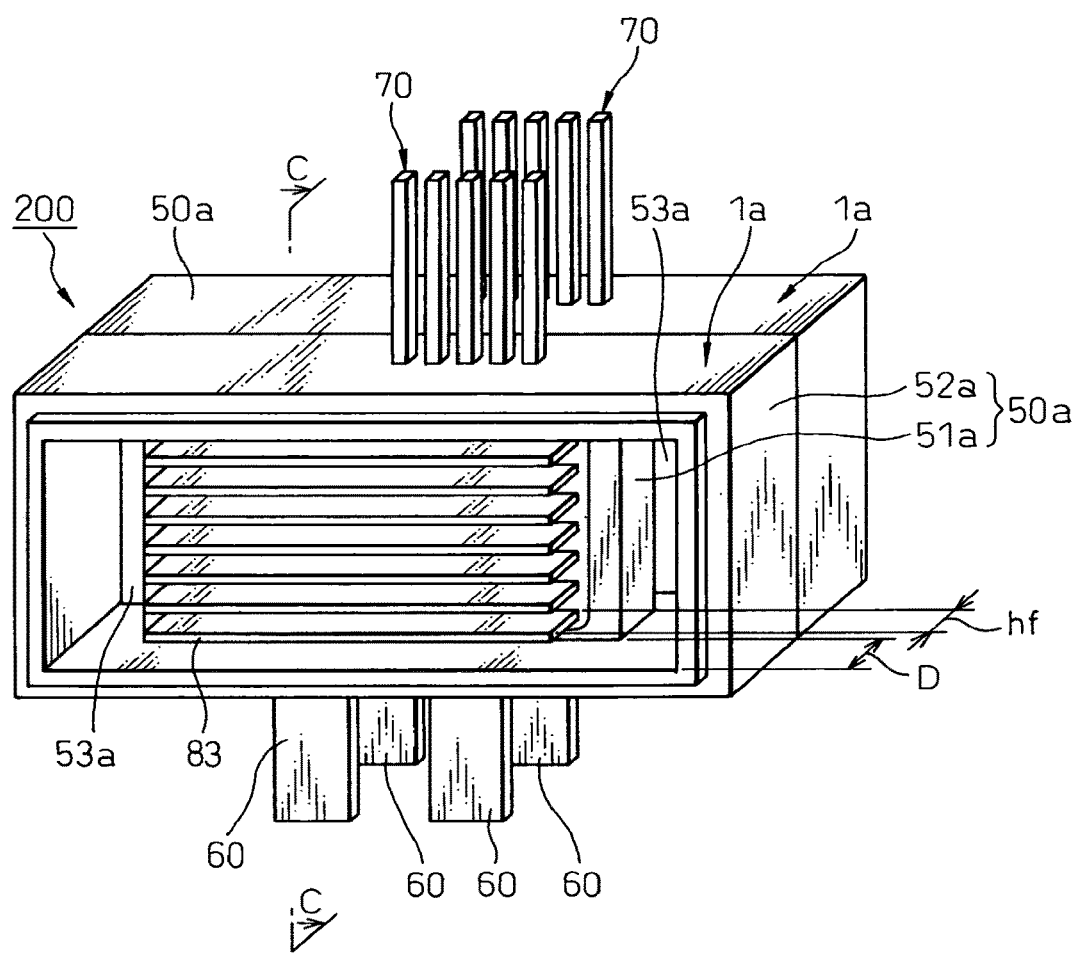
FIG. 4 is a perspective view schematically showing a semiconductor device according to a second embodiment of the invention.
Figure 5A:
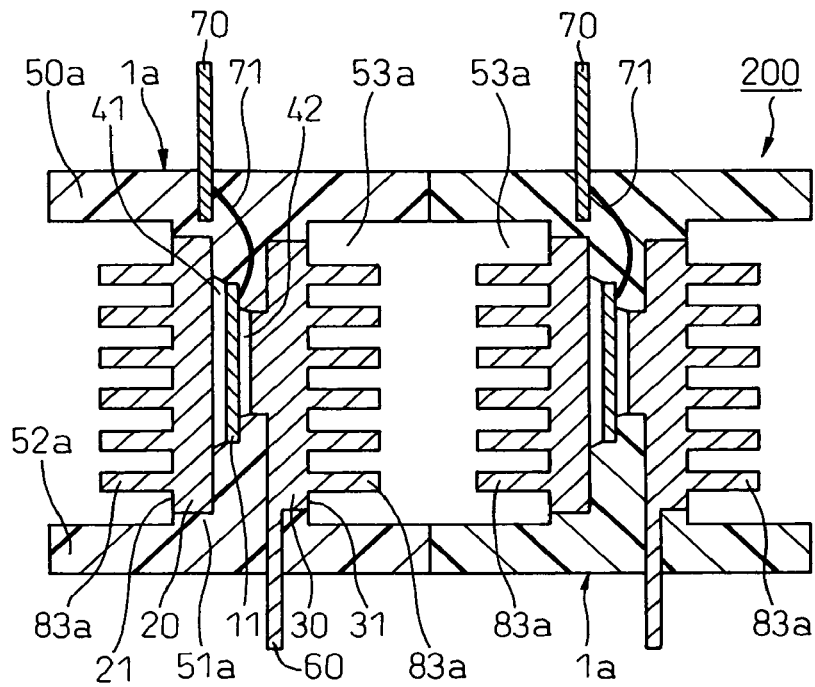
FIG. 5A is a diagram showing an example of the sectional configuration taken in line C-C in FIG. 4.

FIG. 4 is a perspective view schematically showing a configuration of a semiconductor device 200 according to the second embodiment of the invention. FIG. 5A is a diagram showing an example of the sectional configuration along a one-dot chain line C-C in FIG. 4, and FIG. 5B a diagram showing another example of the sectional configuration along a one-dot chain line C-C in FIG. 4.

In the semiconductor device according to the first embodiment, heat is radiated from the heat radiation surfaces 21, 31 of the heat sinks 20, 30 made of metal. To improve the heat radiation performance, therefore, the heat radiation surfaces 21, 31 preferably have rough surfaces.

The rough heat radiation surfaces 21, 31 are formed by being roughened or grooved by etching or machining.

Also, to improve the heat radiation from the heat radiation surfaces 21, 31 of the heat sinks 20, 30, as shown in FIGS. 4, fins 83 projecting from the heat radiation surfaces 21, 31 of the heat sinks 20, 30 are preferably formed.

The fins 83 are made, for example, of cooper or alminium. The fins 83 can be formed with the heat sinks 20, 30 by integral molding in press working. Alternately, the fins 83 can be separately made and joined to the heat sinks 20, 30.

Figure 5B:
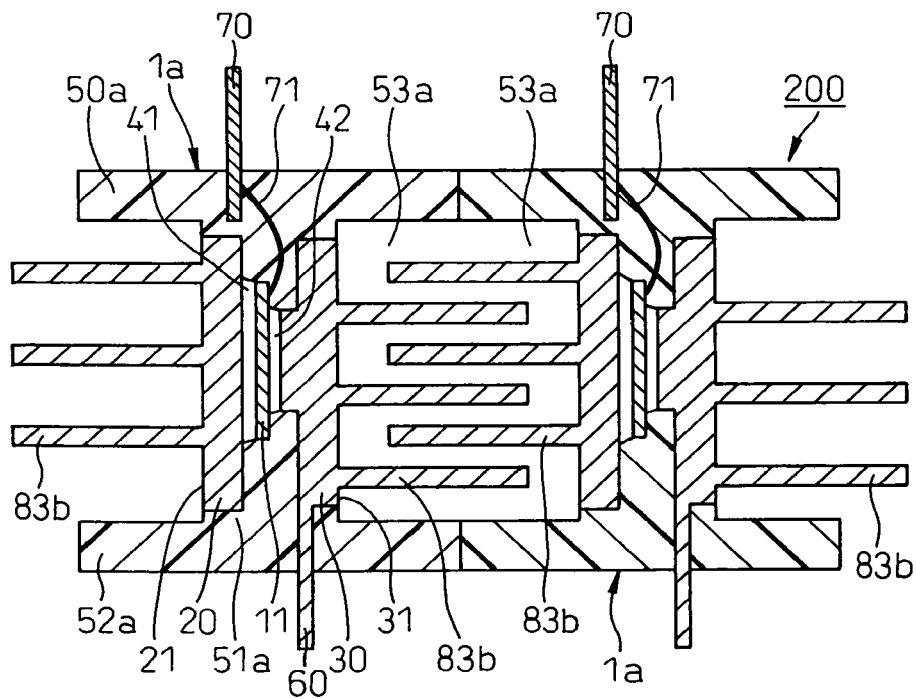
FIG. 5B shows another example of the sectional configuration taken in line C-C in FIG. 4.

The semiconductor device 200 shown in FIGS. 4, 5A, 5B is also configured of a plurality of semiconductor modules 1 connected to each other. The connection structure and the operational effect are basically similar to those of the semiconductor device shown in FIGS. 3A, 3B.

Specifically, also in the semiconductor device 200 having a plurality of the stacked semiconductor modules 1 as shown in FIGS. 4, 5A, 5B according to this embodiment, the refrigerant path can be configured simply by connecting the individual semiconductor modules 1a. Thus the cooling structure can be easily realized, with the result that the device can be reduced and simplified thereby making it possible to simplify the assembly work.

Also in the semiconductor device 200, the terminal position accuracy is improved over the prior art in spite of the fact a multiplicity of the semiconductor modules 1 are connected. Thus, the positioning of the terminals is facilitated in mounting the semiconductor device on the circuit board.

Further, in the semiconductor device 200 according to this embodiment, as shown in FIGS. 4, 5A, 5B, the heat radiation surfaces 21, 31 of the plurality of the stacked semiconductor modules 1 are arranged in opposed relation to each other, and the fins 83, 83a, 83b are arranged on the surfaces of the heat radiation surfaces 21, 31.

In this case, as shown in FIG. 4, hf is the height of each fin 83, and D is the height of each wall part 52 from the heat radiation surfaces 21, 31.

In the example shown in FIG. 5A, the wall part 52 are projected more than the fins 83a. Specifically, the fin height hf and the wall part height D have the relation hf<D, and therefore, the fins 83a arranged on the heat radiation surfaces 21, 31 in opposed relation to each other do not advantageously interfere with each other.

In the example shown in FIG. 5B, on the other hand, the fins 83b are projected more and taller than the wall part 52a. In other words, the fin height hf and the wall part height D hold the relation hf>D.

On the heat radiation surfaces 21, 31 in opposed relation to each other, the fins 83b on one of the heat radiation surfaces are displaced from the fins 83b on the other heat radiation surface. Therefore, the fins 83b formed on the heat radiation surfaces 21, 31 in opposed relation to each other do not advantageously interfere with each other.

On the heat radiation surfaces 21, 31 in opposed relation to each other, the fins 83 on one of the heat radiation surfaces and the fins 83 on the other heat radiation surface are preferably displaced from each other also in the case where the fin height hf and the wall part height D hold the relation hf=D. By doing so, the fins 83 can be advantageously prevented from interfering with each other.

In the example shown in FIGS. 4, 5A, 5B, the fins 83, 83a, 83b have the form similar to the teeth of a comb projected from the surfaces of the heat radiation surfaces 21, 31 of the heat sinks 20, 30.

In the case where the fin height hf and the wall part height D hold the relation hf≥D, therefore, the fins 83b on the heat radiation surfaces 21, 31 in opposed relation to each other are arranged in such a manner as to engage each other.

The roughness on the heat radiation surfaces 21, 31 of the heat sinks 20, 30 and the fins 83 projected from the heat radiation surfaces 21, 31 can of course be formed also in the semiconductor device having only one semiconductor module 1 to improve the heat radiation performance.

FIGS. 5A, 5B show that one end of each main current electrode terminal 60 formed integrally with the upper heat sink 30 is projected out of the molded resin 50a.

Also, FIGS. 5A, 5B show that the control terminals 70 for the semiconductor chips 11, 12 are projected out of the molded resin 50a and electrically connected to the semiconductor chips 11 through the bonding wires 71.

Also in this embodiment, the various modifications described in the foregoing embodiments are applicable as far as possible.

(Third Embodiment)

Figure 6A:
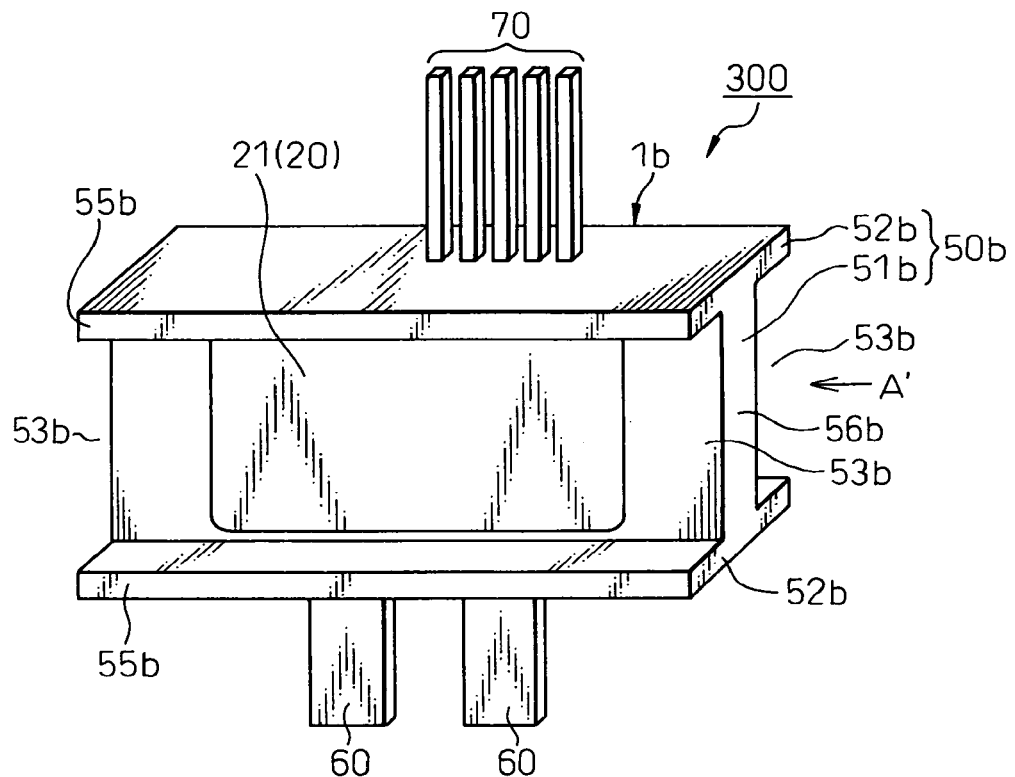
FIG. 6A is a perspective view showing a general configuration of a semiconductor device according to a third embodiment of the invention.
Figure 6B:
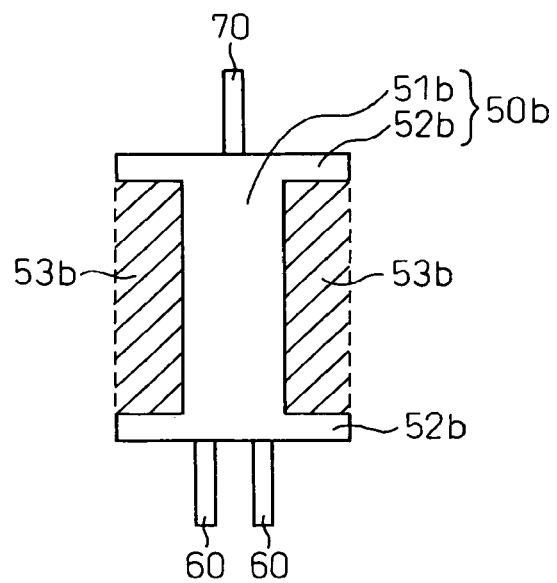
FIG. 6B is a side view taken along the arrow A' in FIG. 6A.

According to the third embodiment of the invention, a position of the openings formed as a refrigerant path in the molded resin is different from that of the opening in the first and second embodiments. FIGS. 6A, 6B are schematic diagrams showing a semiconductor device 300 according to the third embodiment of the invention. FIG. 6A is a perspective view, and FIG. 6B a side view as taken in the direction of arrow A'.

In the first and second embodiments, the refrigerant path 53 is formed as openings 53 between the sealing part 51 and the wall part 52 of the molded resin 50

In the semiconductor device 300 according to this embodiment, in contrast, as shown in FIGS. 6A, 6B, the molded resin 50b includes the sealing part 51b and the wall part 52b, and the refrigerant path is formed as the openings 53b on the wall part 52b. This openings 53b is indicated as an area hatched for convenience sake in FIG. 6B.

Also according to this embodiment, the semiconductor device 300 comprises the semiconductor module 1b including the semiconductor chips 11, 12 as the semiconductor elements, the heat sinks 20, 30 as the metal plates and the molded resin 50 as the sealing part, wherein the heat radiation surfaces 21, 31 of the heat sinks 20, 30 of the semiconductor module 1b are cooled by the refrigerant, and wherein a part of the molded resin 50b forms the refrigerant path 53 in which the refrigerant flows.

Also, in the semiconductor device 300 according to this embodiment, it is not necessary to use the cooling tube and the additional members used in the prior art, and therefore the size of the device is not be increased, resulting in a compact, simple cooling structure.

Further, the semiconductor device according to this embodiment may comprise either a single or a plurality of semiconductor modules 1b connected in sequence.

Figure 7A:
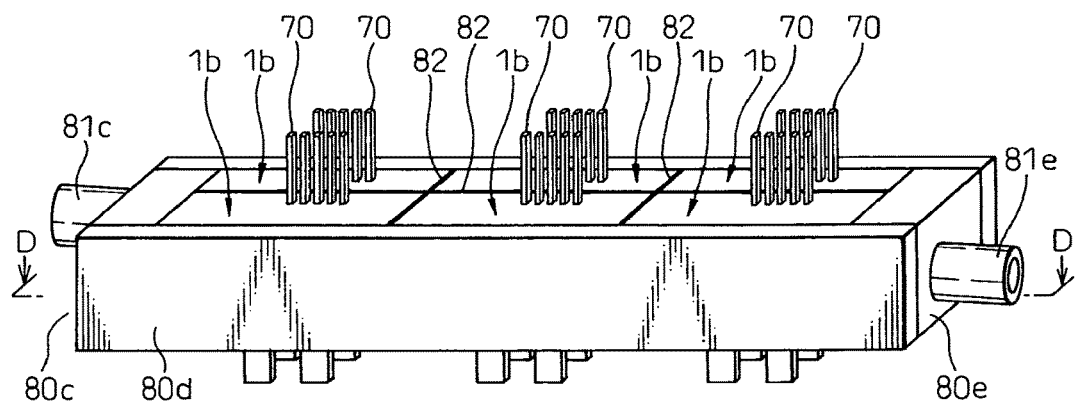
FIG. 7A shows a configuration of a semiconductor device comprising a plurality of semiconductor modules connected to each other according to the third embodiment.
Figure 7B:
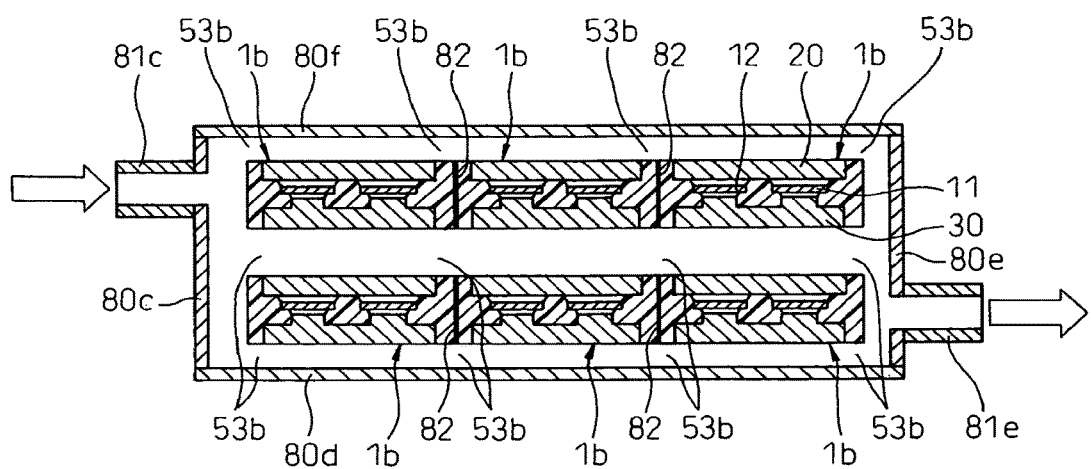
FIG. 7B is a sectional view taken in line D-D in FIG. 7A.

FIGS. 7A, 7B show an example of the semiconductor device according to this embodiment, in which a plurality of the semiconductor modules 1 are stacked and connected in sequence, and the respective refrigerant paths 53 communicate with each other. FIG. 7A is a perspective view of the semiconductor device, and FIG. 7B a sectional view taken in one-dot chain line D-D in FIG. 7A.

In the semiconductor device shown in FIGS. 7A, 7B, a plurality of (2×3 in the shown case) semiconductor modules 1b are stacked and connected in sequence, and the openings 53b formed as the respective refrigerant paths communicate with each other.

Also, this stack structure is connected to a cover plate 80c having a refrigerant inlet 81c, a cover plate 80e having a refrigerant outlet 81e and cover plates 80d, 80f having no inlet and outlet, wherein the inlet 81c, the outlet 81e and the openings 53 communicate with each other. In this way, the inlet 81c, the outlet 81e and the openings 53b are connected to each other, so that the refrigerant entering the inlet 81c exits from the outlet 81e through the openings 53b.

An example of assembling the semiconductor device having six semiconductor modules 1 shown in FIGS. 7A and 7B is as following. First, a pair of two semiconductor modules 1b is formed by bonding the end surfaces 55b of the wall parts 52b of the two semiconductor modules 1. Next, three pieces of the pair of two semiconductor modules 1 are connected in sequence by bonding the side surfaces 55b of the wall parts 52b of the pair. Finally, the semiconductor device is formed by covering four sides having no terminals of the connected semiconductor modules with the cover plates 80c-80f. If the semiconductor device has only three semiconductor modules, the three semiconductor modules are connected in sequence by bonding the side surfaces 55*b* of the wall parts 52*b* of the three semiconductor modules. It is noted that the semiconductor device in FIGS. 7A and 7B can be alternatively formed by bonding a pair of the three semiconductor modules at the end surfaces 55*b* of the wall parts 52*b*.

Further, according to this embodiment, the surfaces of the wall parts 52 to connect the modules and the covers, i.e. the side and end surfaces of the wall parts 52 may have a convex or a concave portion for the positioning as shown in FIGS. 3A, 3B.

As described above, also in this embodiment, the semiconductor device is configured of a plurality of the semiconductor modules 1 stacked and connected to each other, while the respective refrigerant paths 53 communicate with each other. With this semiconductor device, the size is reduced, and the structure and the assembly work are simplified, so that even in the case where a multiplicity of the semiconductor modules 1 are connected, the terminal position accuracy is improved over the prior art.

Figure 8:
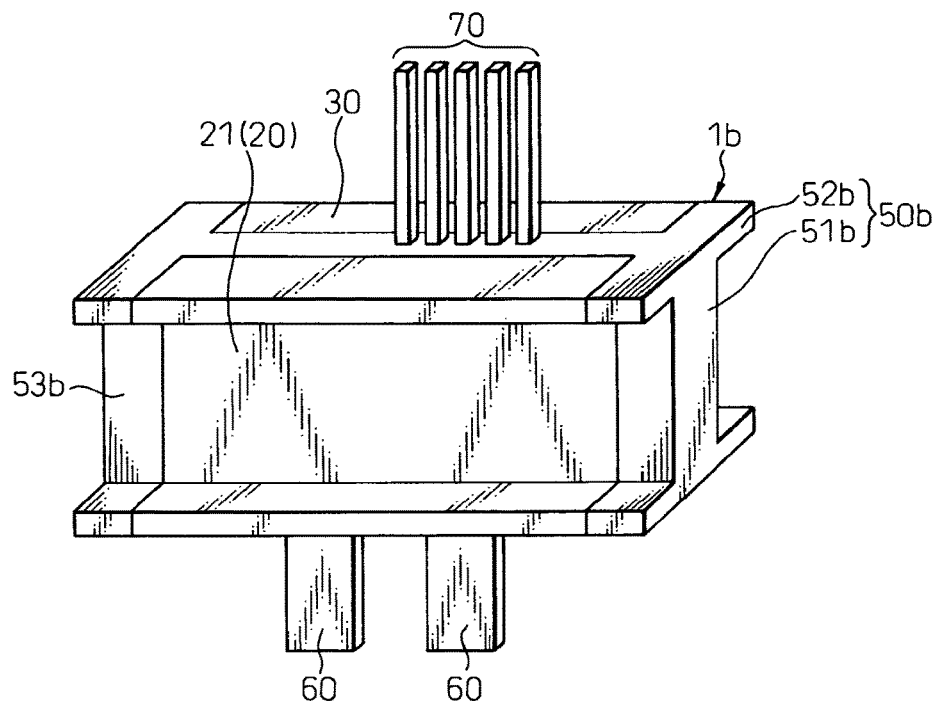
FIG. 8 is a perspective view showing a semiconductor device according to a modification of the third embodiment.

FIG. 8 is a perspective view showing a semiconductor device as a modification of the third embodiment.

As shown in FIG. 8, the heat sinks 20, 30 are modified to the shape of the wall part 52*b*, and the exposure area of the heat sinks 20, 30 is increased. Thus, the area of the heat sinks 20, 30 to be in contact with the refrigerant increases for an improved heat radiation performance.

The semiconductor device according to this embodiment may also comprise either a single semiconductor module 1*b* or connected semiconductor modules 1*b*.

The semiconductor device according to this embodiment can also be combined with any of the embodiments or modifications thereof described above, as far as possible.

Also in this embodiment, for example, the insulating layers 21A, 31A (FIG. 2) may be formed as the heat radiation surfaces 21, 31 of the heat sinks 20, 30, the heat radiation surfaces 21, 31 may be roughened, or the fins 83 (FIGS. 4, 5A, 5B) may be arranged on the heat radiation surfaces 21, 31.

(Fourth Embodiment)

Figure 9:
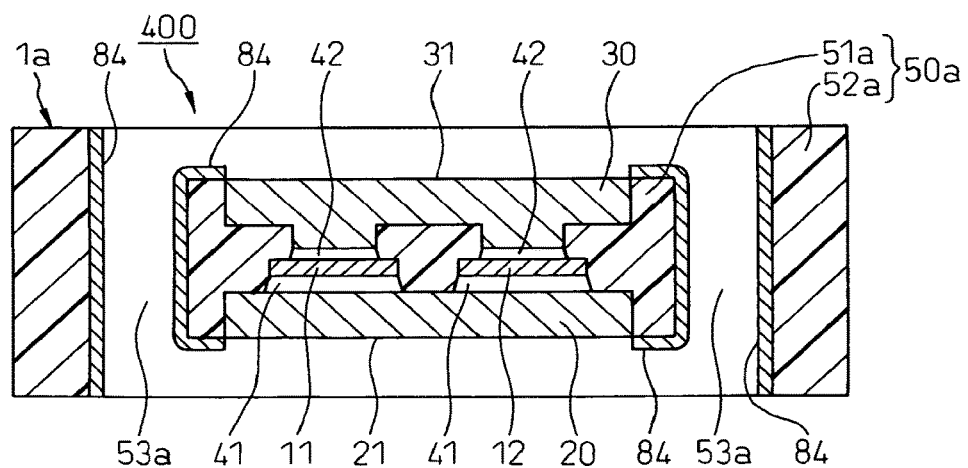
FIG. 9 is a diagram showing a sectional configuration of a semiconductor device according to a fourth embodiment of the invention.

A fourth embodiment of the invention is intended to improve corrosion resistance to the refrigerant flowing in the refrigerant path. FIG. 9 is a diagram showing a schematic sectional configuration of a semiconductor device 400 according to the fourth embodiment of the invention.

As shown in FIG. 9, in the semiconductor device 400 according to this embodiment, films 84 having a corrosion resistance to the refrigerant are formed on the inner wall surfaces of the openings 53 which are refrigerant paths. The films 84 are made of, for example, ceramic, glass or parylene.

The semiconductor device 400 according to this embodiment comprises the semiconductor module 1*a* including the semiconductor chips 11, 12, the heat sinks 20, 30 as metal plates and the molded resin 50 as a seal member, wherein the heat radiation surfaces 21, 31 of the heat sinks 20, 30 of the semiconductor module 1*a* are cooled by the refrigerant, and wherein the films 84 having the corrosion resistance to the refrigerant are formed on the inner wall surfaces of the refrigerant paths 53.

With the semiconductor device 400 according to this embodiment, unlike in the prior art, the additional members such as the cooling tube and the case are not required, thus not increasing the size. As a result, a compact, simple cooling structure is realized, and the corrosion resistance to the refrigerant is improved.

Roughening the heat radiation surface, forming fins on the heat radiation surfaces, and stacking the semiconductor modules 1*a* can be arbitrarily applied to the semiconductor device 400 according to this embodiment. In this way, this embodiment can be combined with any of the aforementioned embodiments or modifications thereof appropriately as far as possible.

(Fifth Embodiment)

The fifth embodiment of the invention is realized by using a different method of stacking the semiconductor modules 1*c*. In other words, the semiconductor modules 1*c* are stacked at an angle, i.e. tilted. The semiconductor device 500 according to this embodiment has at least one semiconductor module 1*c*.

Figure 10A:
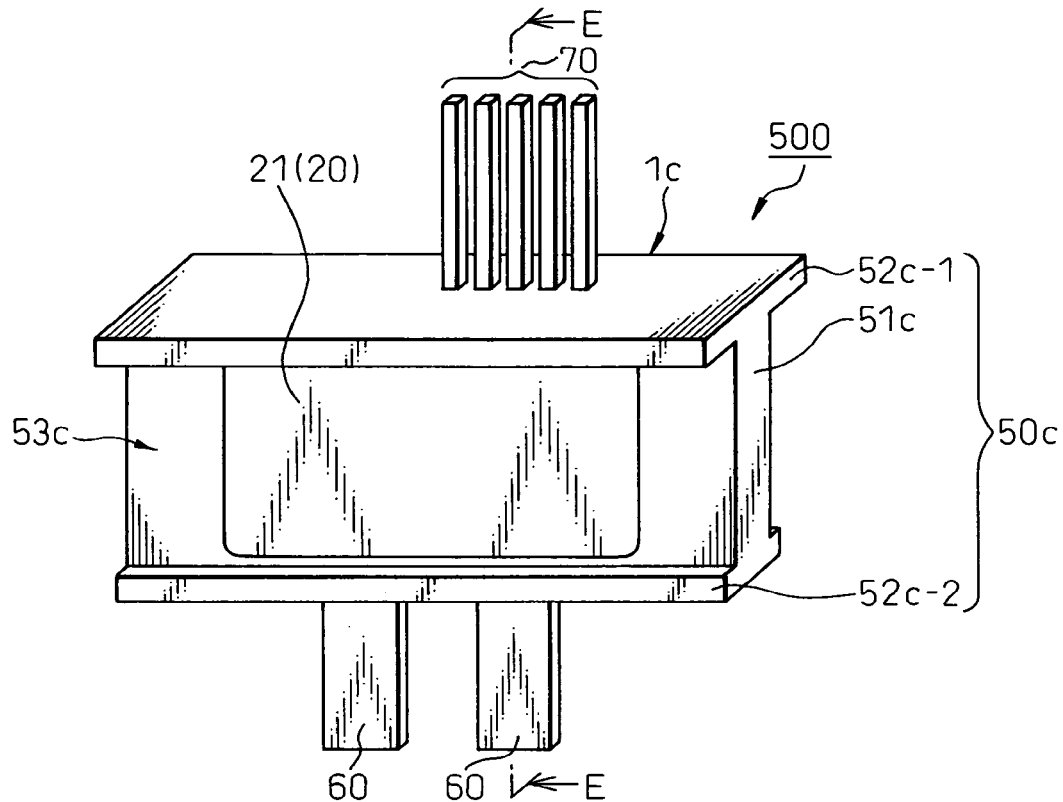
FIG. 10A is a perspective view showing a general configuration of a semiconductor device according to a fifth embodiment of the invention.
Figure 10B:
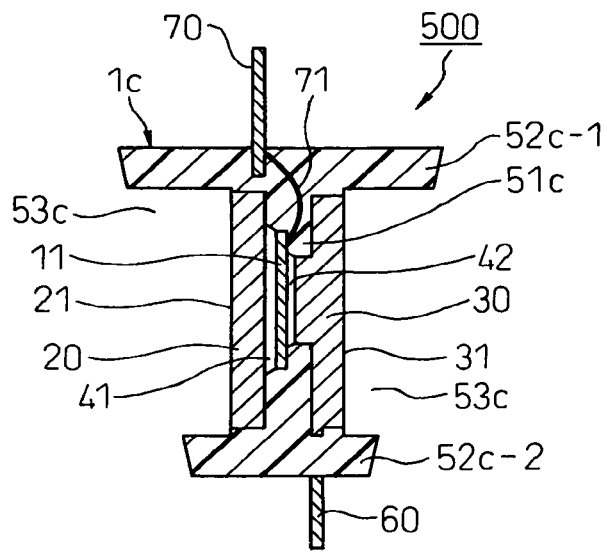
FIG. 10B is a sectional view taken in line E-E in FIG. 10A.

FIGS. 10*a*, 10*b* are schematic diagrams showing the semiconductor device 500 having the semiconductor module 1*c* according to the fifth embodiment of the invention. FIG. 10A is a perspective view, and FIG. 10B a sectional view taken in one-dot chain line E-E in FIG. 10A.

As shown in FIGS. 10A, 10B, in the semiconductor device 500 according to this embodiment, a portion of the wall part 52*c* of the molded resin 50*c* is formed shorter than the opposite portion of the wall part 52*c*.

The semiconductor device 500 as shown in FIGS. 10A, 10B, is formed by modifying the semiconductor 300 shown in FIGS. 6A, 6B. According to the semiconductor device 500, the lower wall part 52*c*-2 is formed shorter than the upper wall part 52*c*-1. As a result, as shown in FIG. 10B, the cross section of the semiconductor device 500 has a sectorial shape.

Also in the semiconductor device 500 according to this embodiment, a part of the molded resin 50*c* is configured as a refrigerant path 53 in which the refrigerant flows, thereby realizing a compact, simple cooling structure.

Figure 11:
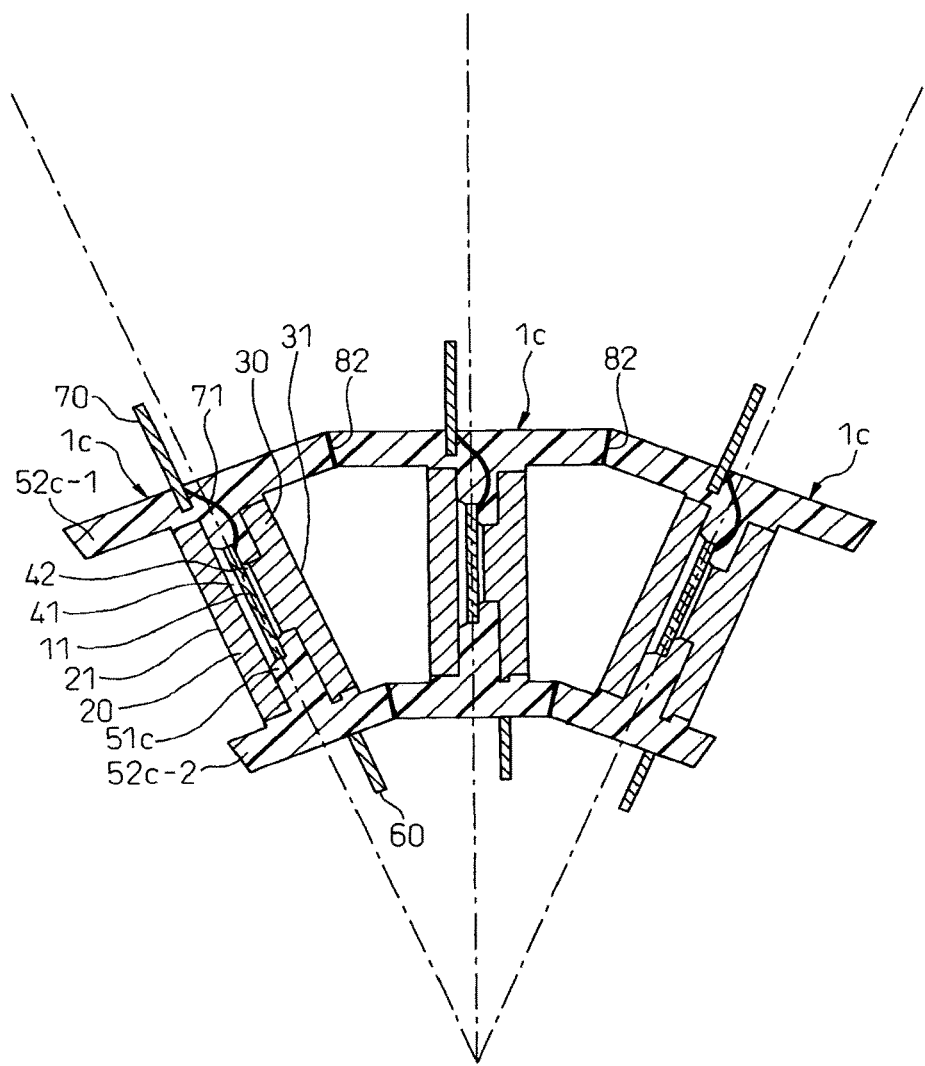
FIG. 11 is a sectional view showing a general configuration of a semiconductor device comprising a plurality of semiconductor modules connected to each other according to the fifth embodiment.

Further, according to this embodiment, the advantage of the sectorial section of the semiconductor device 500 becomes remarkable in the case where a plurality of the semiconductor modules 1*c* are connected. FIG. 11 is a sectional view schematically showing the configuration of the semiconductor device according to this embodiment in which a plurality of the semiconductor modules 1 are connected with the respective refrigerant paths 53 communicating with each other.

As shown in FIG. 11, according to this embodiment, there is provided a semiconductor device comprising stacked and connected semiconductor modules 1*c*, which are connected in a sectorial form.

The sectorial connection of the plurality of the semiconductor modules 1*c* includes a case in which additional semiconductor modules 1*c* are connected into an annular or polygonal form.

In the case where the semiconductor device according to this embodiment is used as an inverter for the motor or the like, the similarity in shape of the semiconductor device to a rotary machine such as a motor can shorten the wiring distance and simplifies the connection, thereby effectively reducing noises.

The semiconductor device 500 shown in FIGS. 10A, 10B has the refrigerant paths i.e. openings 53 of the wall part 52*c*. However, the refrigerant paths according to the present embodiment may be configured as openings 53 of the sealing part 51 between the heat sink 20, 30 and the wall part 52.

Specifically, the semiconductor device shown in FIG. 1 can also be formed to have a sectorial section unique to this embodiment by differentiating the height of the upper and lower portion of the wall parts 52 as shown in FIGS. 10A, 10B.

The semiconductor device according to this embodiment can also be combined appropriately with any of the aforementioned embodiments or modifications thereof.

(Sixth Embodiment)

According to a sixth embodiment of the invention, there is provided a semiconductor device in which a plurality of semiconductor modules 1 are stacked to make a power circuit.

Figure 12:
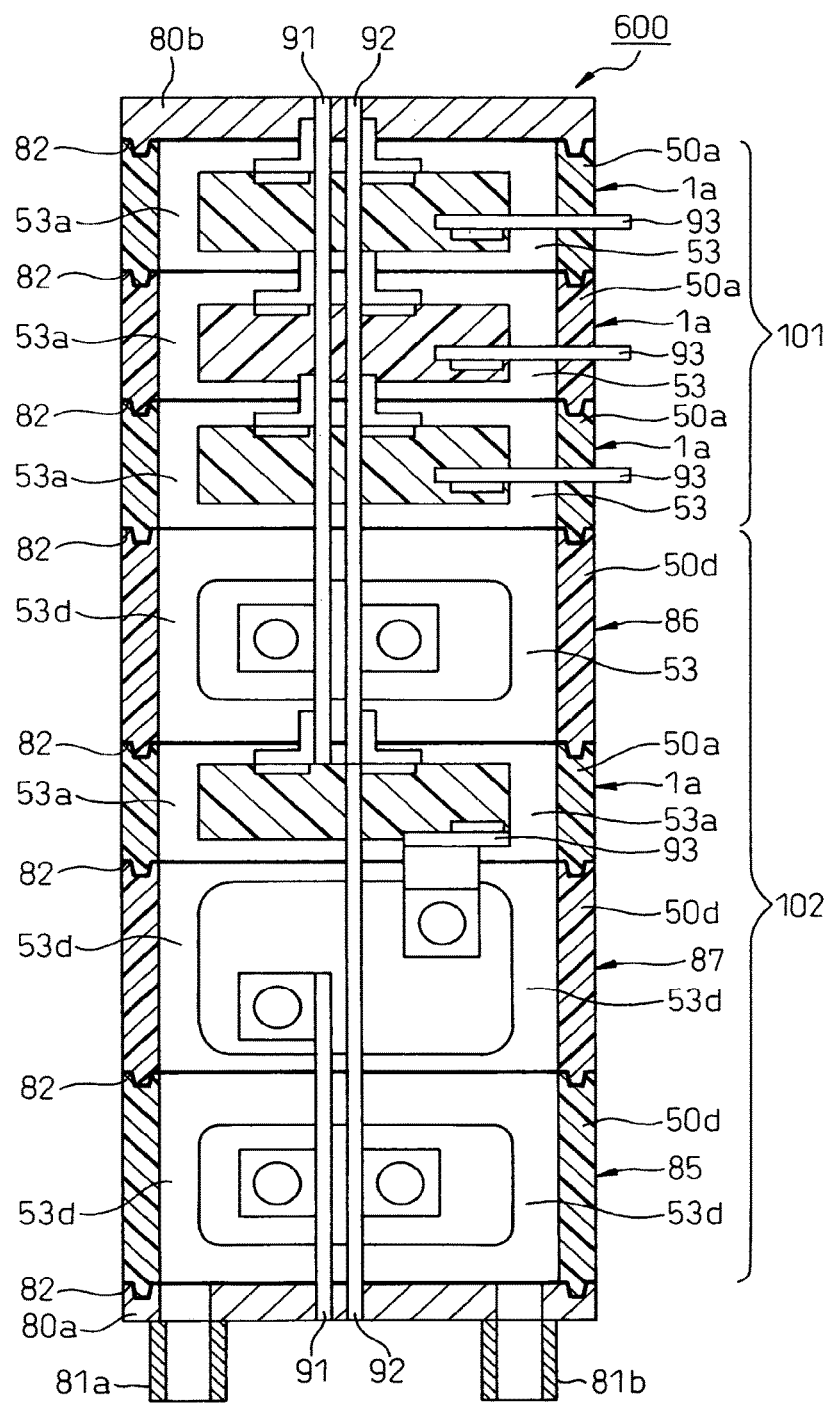
FIG. 12 is a sectional view showing a general configuration of a power converter as a semiconductor device according to a sixth embodiment of the invention.

FIG. 12 is a sectional view schematically showing a general configuration of a power converter 600 as a semiconductor device according to the sixth embodiment of the invention. The power converter 600 shown in FIG. 12 represents an example using the semiconductor module 1 according to the first embodiment described above.

The power converter 600 is a power circuit which is formed by stacking a plurality of the semiconductor modules 1a, capacitors 85, 86 and a reactor 87, which are also heat generating elements. The resulting assembly is electrically connected with a first bus bar 91, a second bus bar 92 and a third bus bar 93.

The first bus bar 91 and the second bus bar 92 are input bus bars for the input connection of the power circuit, and the third bus bar 93 is an output bus bar for the output connection.

The first capacitor 85, the second capacitor 86 and the reactor 87, which are the heat generating parts, like the semiconductor module 1a, are sealed with the molded resin 50d, being a seal member, which has openings 53d as a refrigerant path.

The semiconductor modules 1a, the capacitors 85, 86 and the reactor 87 are stacked as shown in FIG. 12. At the ends of the stack structure, a cover plate 80a having an inlet 81a and an outlet 81b and a cover plate 80b having no inlet and outlet are arranged, and each bonded by using an adhesive 82.

In the power converter 600, refrigerant paths are formed by the openings 53 communicating with each other, and the refrigerant flows from the inlet 81a through the refrigerant path to outlet 81b, thereby cooling the capacitors 85, 86 and the reactor 87 as well as the semiconductor modules 1.

Figure 13:
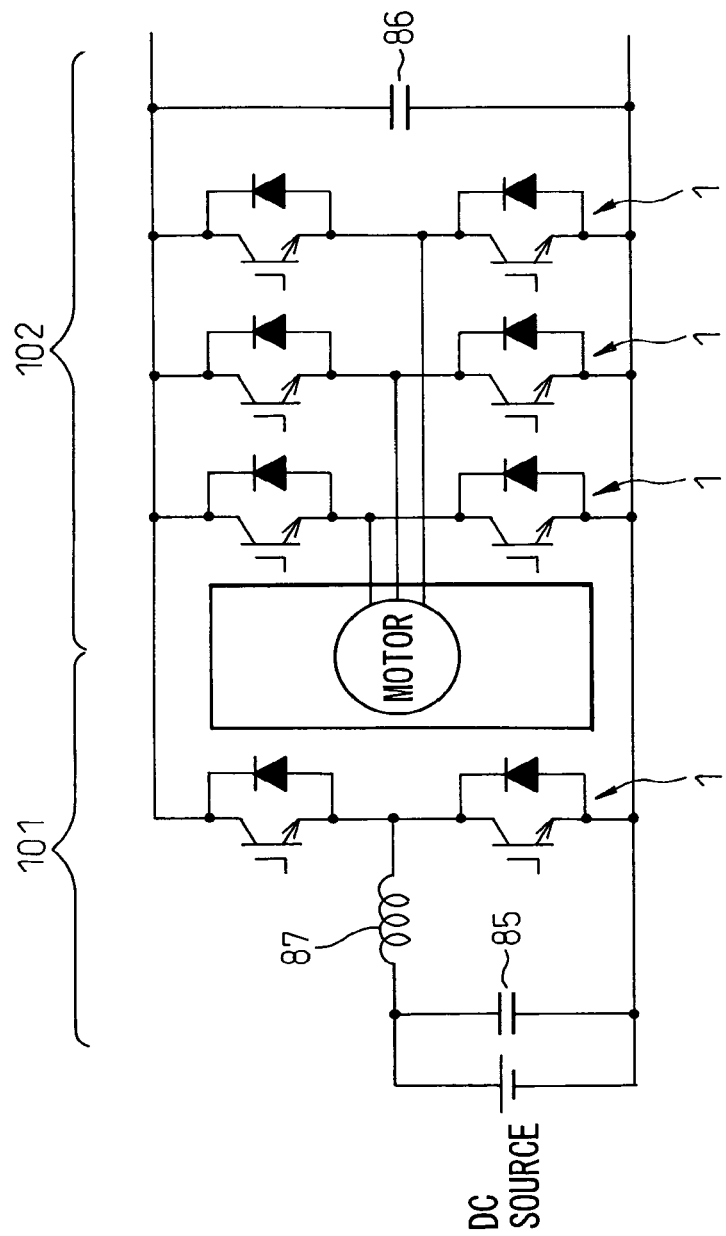
FIG. 13 is a diagram showing an equivalent circuit of the power converter of FIG. 12.

The circuit configuration of the power converter 600 is shown in FIG. 13. A plurality of the semiconductor modules 1 and the second capacitor 86 make up a converter 102, while the semiconductor module 1, the first capacitor 85 and the reactor 87 make up an inverter 101.

As described above, this embodiment provides the power converter 600 as a semiconductor device comprising a plurality of the semiconductor modules 1a, which are stacked and connected, with the respective refrigerant paths 53 communicating with each other, wherein the stacked semiconductor modules 1 is configured as a power circuit.

As a result, the power converter 600 according to this embodiment exhibits the same advantageous effects as the semiconductor device having the plurality of the semiconductor modules 1a connected as described above.

Further, as a feature of this embodiment, the heat generating elements 85, 86, 87 are stacked with the semiconductor modules 1, and cooled by the refrigerant.

Also, as shown in FIG. 12, further, a feature of the power conversion circuit 600 according to this embodiment is that the first bus bar 91 and the second bus bar 92, which are the input wirings of the power circuit, are arranged in proximity and parallel to each other. The device size can be reduced by using this bus bar arrangement.

Figure 14A:
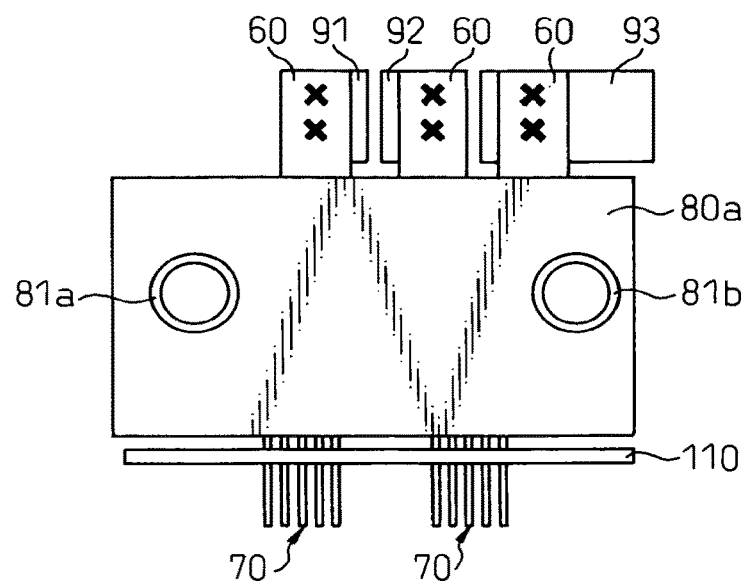
FIG. 14A is a front view showing the detailed wiring configuration of the semiconductor module of the power converter shown in FIG. 13.
Figure 14B:
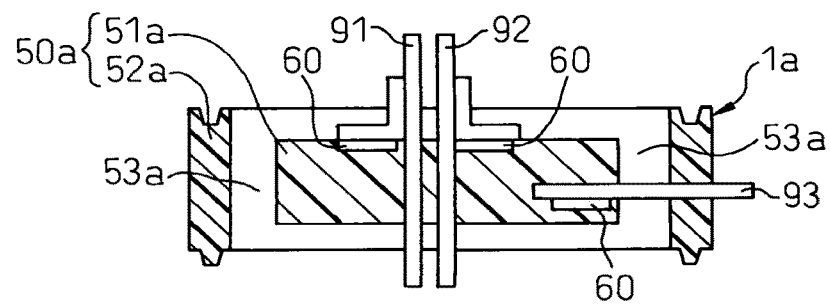
FIG. 14B is a top plan view of the configuration shown in FIG. 14A.
Figure 14C:
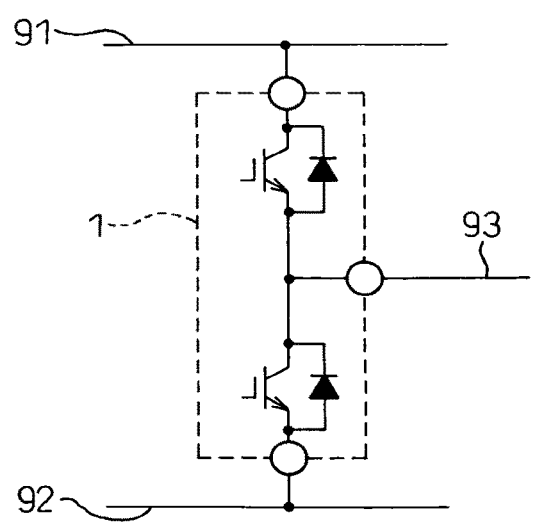
FIG. 14C is a diagram showing an equivalent circuit.

FIGS. 14A, 14B, 14C are diagrams showing a detailed wiring configuration of the bus bars of the semiconductor module 1 in the power converter 600. FIG. 14A is a front view, FIG. 14B a top plan view of the semiconductor module, and FIG. 14C a diagram showing an equivalent circuit of the wiring configuration. In FIG. 14B, the sectional view of the configuration of the molded resin 50 of the semiconductor module 1a is shown.

As shown in FIG. 14A the first bus bar 91 and the second bus bar 92, which are the input bus bars, are connected by screws or welding to the electrode terminal 60 of the semiconductor module 1a, which is formed as an input terminal of the power converter 600, and the third bus bar 93, which is the output bus bar, is connected by screws or welding to the electrode terminal 60 of the semiconductor module 1, which is formed as an output terminal.

The control terminals 70 of the semiconductor module 1 are electrically connected to the control circuit board 110. The control terminals 70 are inserted into the openings formed in a control circuit board 110 and bonded to the circuit board 110 by soldering.

In this case, as shown in FIG. 14C, two power circuits are included in each semiconductor module 1. As an alternative, as shown in FIGS. 15A, 15B, 15C, a circuit configuration equivalent to the circuit shown in FIG. 14A, 14B, 14C may be realized using two semiconductor modules 1.

Figure 15A:
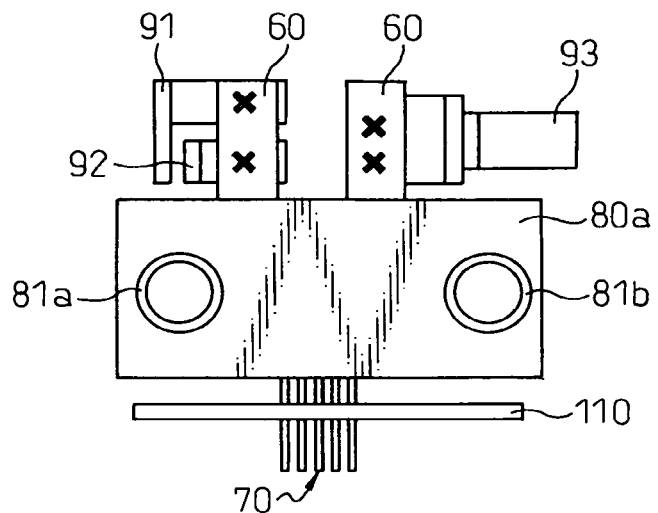
FIG. 15A is a front view showing another example of the wiring configuration of the semiconductor module of the power converter shown in FIG. 13.
Figure 15B:
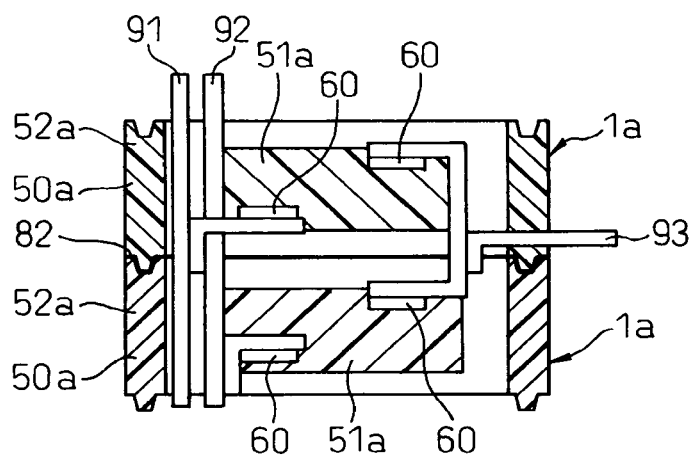
FIG. 15B is a top plan view of the configuration shown in FIG. 15A.
Figure 15C:
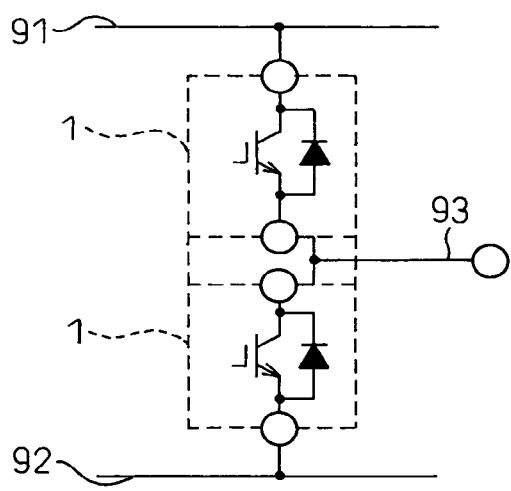
FIG. 15C is a diagram showing an equivalent circuit.

FIGS. 15A, 15B, 15C are diagrams showing another example of the wiring configuration of the bus bars of the semiconductor modules 1 in the power converter 600. FIG. 15A is a front view, FIG. 15B a top plan view of the semiconductor module, and FIG. 15C a diagram showing an equivalent circuit of the wiring configuration. FIG. 15B also shows a sectional configuration of the molded resin 50a of the semiconductor modules 1a.

In the example shown in FIG. 15A, input bus bars 91, 92 are connected by screws or welding to the main current electrode terminal 60, which is formed as an input terminal, and an output bus bar 93 is connected by screws or welding to the main current electrode terminal 60, which is formed as an output terminal. Also, the control terminals 70 are electrically connected to the control circuit board 110.

Thus, the configuration shown in FIGS. 15A, 15B, 15C is an example in which the two stacked semiconductor modules 1 are connected electrically to each other by the bus bars 91 to 93, thereby realizing the circuit configuration equivalent to the circuit shown in FIGS. 14A, 14B, 14C. This configuration is applicable to the power converter 600 in FIG. 12.

Figure 16:
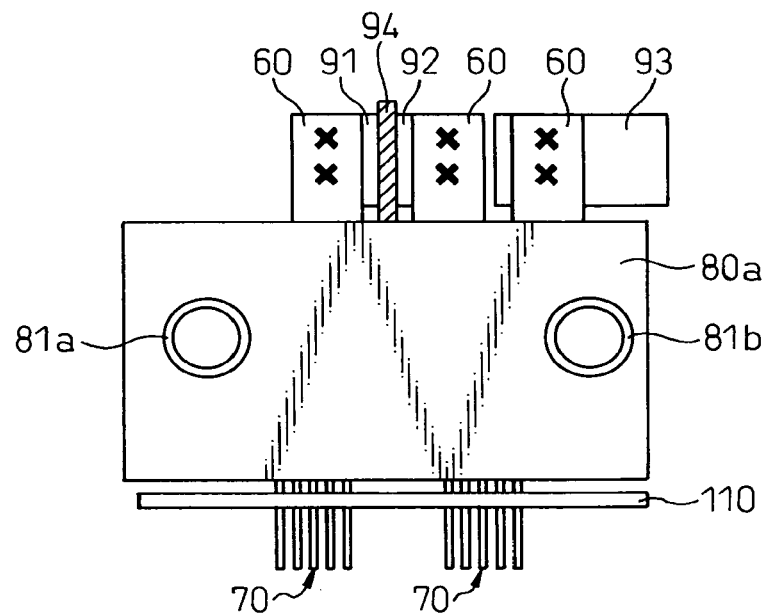
FIG. 16 is a diagram showing a first modification of the sixth embodiment.
Figure 17:
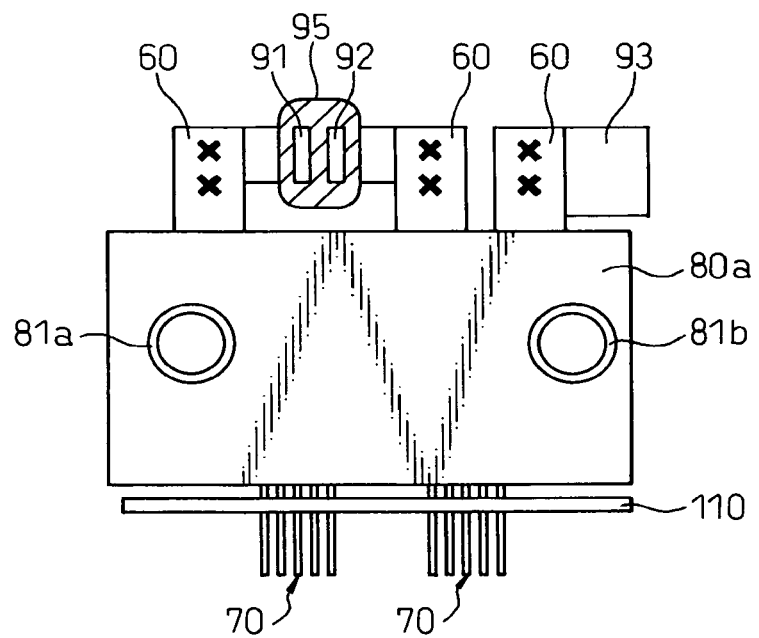
FIG. 17 is a diagram showing a second modification of the sixth embodiment.

FIGS. 16, 17 are diagrams showing first and second modifications of this embodiment.

In the first modification shown in FIG. 16, an electrically insulating member 94 of such a material as resin or ceramic is interposed between the first bus bar 91 and the second bus bar 92 arranged in proximity and parallel to each other.

In the second modification shown in FIG. 17, on the other hand, the first bus bar 91 and the second bus bar 92 arranged in proximity and parallel to each other are contained and sealed by the electrically insulating member 95 of such a material as resin or ceramics.

The configuration using the insulating member 94, 95 secures the electrical insulation between the first bus bar 91 and the second bus bar 92 arranged in proximity and parallel to each other, and therefore can reduce the interval between the first bus bar 91 and the second bus bar 92 being as the input bus bars, thereby advantageously making it possible to reduce the size and the parasitic inductance of the wiring.

Also with the semiconductor device according to this embodiment, any of the embodiments described above and the modifications thereof can be appropriately combined as far as possible.

(Other Embodiments)

According to each of the embodiments described above, stacked semiconductor modules 1 are connected to form a semiconductor device, using the adhesives 82. The semiconductor modules 1, however, are not necessarily connected by bonding but may be connected by other means.

In the semiconductor device shown in FIGS. 3A and 3B, for example, O-rings 82*a* may be used in place of the adhesives 82 (see FIG. 3B).

When the O-rings 82*a* are used, the stacked semiconductor modules 1 held by the cover plates 80*a*, 80*b* are connected to each other by pressing the stacked modules by the cover plates 80*a*, 80*b* arranged at the ends of the stacked modules. The cover plates 80 can be fixed to each other by fastening means, for example, screws (not shown).

In such a case, with the semiconductor device shown in FIGS. 3A and 3B, each adjoining semiconductor modules 1*a* are kept in contact with each other through the O-ring 82*a* so that the contact portion of the semiconductor modules 1 are sealed by the O-ring 82*a*.

By doing so, the refrigerant paths i.e. openings 53 are formed under pressure through the O-rings 82*a*, and therefore the replacement or repair work is facilitated if the stacked semiconductor modules 1 include a defective element. The connection structure using the O-rings can be employed as far as possible in the embodiments described above.

In the case where the semiconductor device is configured of a plurality of the semiconductor modules 1 connected with each other in the aforementioned embodiments, a visible surface of the stack structure of the plurality of the semiconductor modules 1 desirably is used as the printing surfaces of the semiconductor modules 1.

In the semiconductor device, for example, shown in FIGS. 3A and 3B, the outer side surface of the wall part 52*a* of the molded resin 50*a* of each semiconductor module 1*a* included in the stack structure forms a visible surface, i.e. a printing surface.

When characters or numerals are printed on the printing surface of the stacked semiconductor modules 1*a*, the printing surface can be visually checked and therefore the serial numbers, etc. of the semiconductor modules 1*a* can be advantageously confirmed from the viewpoint of maintenance, for example.

According to the embodiments described above, the heat sinks 20, 30, which are metal plates, are arranged on the two sides of the semiconductor elements 11, 12, respectively, and the heat radiation surfaces 21, 31 of the heat sinks 20, 30 are both exposed from the molded resin 50*a*. As an alternative, the heat radiation surface of only one of the heat sinks 20, 30 may be exposed from the molded resin 50*a*.

Further, the heat sink may alternatively be arranged only one side of the semiconductor elements 11, 12, and the heat radiation surface of the particular heat sink may be exposed from the molded resin 50*a*. In the semiconductor device 100, for example, shown in FIGS. 1A and, 1B, the lower heat sink 20 may be omitted and the upper heat sink 30 may be only used. Alternatively, only the lower heat sink 20 may be used without the upper heat sink 30.

Specifically, the heat sinks 20, 30, which are the metal plates of the semiconductor module 1, are arranged at least on one surface of the semiconductor chips 11, 12 as semiconductor elements, and only the surfaces of the heat sinks 20, 30 formed on the one surface of the semiconductor chips 11, 12 may be exposed from the molded resin 50*a*, which is a seal member.

Also, in FIGS. 1A and 1B, the two large openings 53 are formed as the refrigerant path of the sealing part 51*a* between the metal plates 20, 30 and the wall part 52*a*. However, at least one of the openings can be replaced with a plurality of openings or through holes.

The semiconductor module 1*b* of FIGS. 6A and 6B has the refrigerant path formed with the openings 53 in the wall part 52 as a notch cut from a part of the wall part 52. However, the openings formed in the wall part 52 may of course leave the outer frame to form an opening or a plurality of openings.

In short, this invention provides a semiconductor device comprising, as essential parts, semiconductor elements, metal plates thermally connected with the semiconductor elements for transmitting heat from the semiconductor elements, and a seal member for containing and sealing the semiconductor elements and the metal plates in such a manner as to expose the heat radiation surfaces of the metal plate, wherein the heat radiation surfaces are cooled by the refrigerant, and wherein a part of the seal member is formed as a refrigerant path in which the refrigerant flows. The other component parts can be appropriately designed.

What is claimed is:

1. A semiconductor device comprising:
   a semiconductor element;
   a heat sink made of metal thermally connected to the semiconductor element; and
   a resin for completely covering the semiconductor element and the heat sink as one body in such a manner as to expose a heat radiation surface of the heat sink, the resin adhering to the semiconductor element and the heat sink without space;
   wherein a part of the resin offsetting externally from the resin is used as a part of an outer wall surface of a refrigerant path in which a refrigerant flows, the refrigerant cooling the heat radiation surface,
   the refrigerant path is an open area through which the refrigerant flows,
   the wall surface of the refrigerant path directly faces the open area through which the refrigerant flows, and
   the refrigerant flows on the exposed radiation surface of the heat sink.

2. The semiconductor device according to claim 1, wherein the heat radiation surface is a metal.

3. The semiconductor device according to claim 1, wherein the heat radiation surface is a metal coated with an insulator.

4. The semiconductor device according to claim 2, wherein the heat radiation surface of the metal is rough.

5. The semiconductor device according to claim 2, wherein the heat radiation surface of the metal has at least one fin projecting from the same surface.

6. The semiconductor device according to claim 3, wherein the heat radiation surface is formed as the surface of the insulating layer on the surface of the metal.

7. The semiconductor device according to claim 1, wherein an inner wall surface of the refrigerant path is covered with a film having corrosion resistance against the refrigerant.

8. The semiconductor device according to claim 1, wherein electrode terminals for main current are projected from one side of the resin, and wherein control terminals are arranged on the opposite side of the resin.

9. The semiconductor device comprising:
a plurality of semiconductor modules, each of the semiconductor modules according to claim 1,
wherein the semiconductor modules are stacked and connected so that the refrigerant paths of the semiconductor modules are communicated with each other.

10. The semiconductor device according to claim 9,
wherein the heat radiation surface is a metal.

11. The semiconductor device according to claim 9,
wherein the heat radiation surface is a metal coated with an insulator.

12. The semiconductor device according to claim 9,
wherein the heat radiation surfaces of the stacked semiconductor modules are placed opposite with each other.

13. The semiconductor device according to claim 9,
wherein the semiconductor modules are connected at end or side surfaces of the wall parts.

14. The semiconductor device according to claim 13,
wherein the end or side surfaces of the wall parts have a convex or concave part for positioning.

15. The semiconductor device according to claim 13,
wherein the end or side surfaces of the wall parts are bonded.

16. The semiconductor device according to claim 15,
wherein the end or side surfaces of the wall parts are bonded by melting the surfaces.

17. The semiconductor device according to claim 16,
wherein the wall parts are made of at least thermoplastic resin and the end or side surfaces of the wall parts are bonded by melting the thermoplastic resin.

18. The semiconductor device according to claim 12,
wherein the heat radiation surfaces have at least one fin projecting therefrom, and
wherein the height hf of the fin and the height D of the wall part from the heat radiation surface have the relation hf<D.

19. The semiconductor device according to claim 12,
wherein the heat radiation surfaces have at least one fin projecting therefrom,
wherein the height hf of the fin and the height D of the wall part from the heat radiation surface have the relation hf ≥D; and
wherein positions of the find on the heat radiation surfaces differ between one of the heat radiation surfaces and the other opposite heat radiation surface.

20. The semiconductor device according to claim 12,
wherein the fins have a form similar to teeth of a comb projected from the heat radiation surfaces, and
wherein the fins on one of the heat radiation surfaces are places between the find on the other opposite heat radiation surface.

21. The semiconductor device according to claim 12,
wherein the side shape of the wall part of the seal member is an inverted trapezoid.

22. The semiconductor device according to claim 9,
wherein the stacked semiconductor modules are configured as a power circuit.

23. The semiconductor device according to claim 22,
wherein a first bus bar and a second bus bar forming the input wiring of the power circuit are arranged in proximity and parallel to each other.

24. The semiconductor device according to claim 23,
wherein an insulating member is interposed between the first bus bar and the second bus bar.

25. The semiconductor device according to claim 24,
wherein the first bus bar and the second bus bar are covered and sealed by the insulating member.

26. The semiconductor device according to claim 9,
wherein visible surfaces of the stacked semiconductor modules are formed as the printing surfaces of the semiconductor modules.

27. The semiconductor device according to claim 9,
wherein the stacked semiconductor modules are connected to each other by being held under pressure by cover plates arranged at the ends of the stacked semiconductor modules, and further
the adjoining semiconductor modules are kept in contact with an O-ring so as to seal contact portions between the semiconductor modules.

28. A semiconductor device comprising:
a semiconductor element;
a heat sink including a metal plate, thermally and electrically connected to the semiconductor element, which transmits heat from the semiconductor and works as an electrode; and
a resin for completely covering the semiconductor element and the heat sink as one body in such a manner as to expose a heat radiation surface of the heat sink, the resin adhering to the semiconductor element and the heat sink without space;
wherein a part of the resin offsetting externally from the resin is used as a part of an outer wall surface of a refrigerant path in which a refrigerant flows, the refrigerant cooling the heat radiation surface, and
wherein an insulating layer is formed on the heat radiation surface,
wherein the refrigerant flows on a surface of the insulating layer,
wherein the refrigerant path is an open area through which the refrigerant flows, and
wherein the wall surface of the refrigerant path directly faces the open area through which the refrigerant flows.

29. A semiconductor device comprising:
a semiconductor element;
a heat sink including a metal plate, thermally and electrically connected to the semiconductor element, which transmits heat from the semiconductor and works as an electrode; and
a resin for completely covering the semiconductor element and the heat sink as one body in such a manner as to expose a heat radiation surface of the heat sink, the resin adhering to the semiconductor element and the heat sink without space;
wherein a part of the resin offsetting externally from the resin is covered with a film having corrosion resistance against the refrigerant and used as a part of an outer wall surface of a refrigerant path in which a refrigerant flows, the refrigerant cooling the heat radiation surface,
wherein an insulating layer is formed on the heat radiation surface, and
wherein the refrigerant flows on a surface of the insulating layer.

30. A semiconductor device comprising:
a semiconductor element;
a heat sink thermally connected to the semiconductor element; and
a resin for completely covering the semiconductor element and the heat sink as one body in such a manner as to expose a heat radiation surface of the heat sink the resin adhering to the semiconductor element and the heat sink without space;
wherein a part of the resin offsetting externally from the resin is covered with a film having corrosion resistance against the refrigerant and used as a part of an outer wall surface of a refrigerant path in which a refrigerant flows, the refrigerant cooling the heat radiation surface, and wherein the refrigerant flows on the exposed radiation surface of the heat sink.

31. The semiconductor device according to claim 30, wherein the heat radiation surface is a metal.

32. The semiconductor device according to claim 30, wherein the heat radiation surface is a metal coated with an insulator.

33. The semiconductor device according to claim 32, wherein the heat radiation surface is formed as the surface of the insulating layer on the surface of the metal.

34. The semiconductor device according to claim 30, wherein electrode terminals for main current project from one side of the resin, and wherein control terminals are arranged on the opposite side of the molded resin.

35. The semiconductor device comprising a plurality of semiconductor modules, each of the semiconductor modules according to claim 30, wherein the semiconductor modules are stacked and connected so that the refrigerant paths of the semiconductor modules communicate with each other.

36. The semiconductor device according to claim 35, wherein the heat radiation surface is a metal.

37. The semiconductor device according to claim 35, wherein the heat radiation surface is a metal coated with an insulator.

38. The semiconductor device according to claim 35, wherein the heat radiation surfaces of the stacked semiconductor modules are placed opposite to each other.

39. The semiconductor device according to claim 35, wherein the semiconductor modules are connected at end or side surfaces of the wall parts.

40. The semiconductor device according to claim 39, wherein the end or side surfaces of the wall parts have a convex or concave part for positioning.

41. The semiconductor device according to claim 39, wherein the end or side surfaces of the wall parts are bonded.

42. The semiconductor device according to claim 41, wherein the end or side surfaces of the wall part are bonded by melting the surfaces.

43. The semiconductor device according to claim 42, wherein the wall parts are made of at least thermoplastic resin and the end or side surfaces of the wall part are bonded by melting the thermoplastic resin.

44. The semiconductor device according to claim 35, wherein visible surfaces of the stacked semiconductor modules are formed as the printing surfaces of the semiconductor modules.

45. The semiconductor device according to claim 35, wherein the stacked semiconductor modules are connected to each other by being held under pressure by cover plates arranged at the ends of the stacked semiconductor modules, and further the adjoining semiconductor modules are kept in contact with an O-ring so as to seal contact portions between the semiconductor modules.

* * * * *